(12) United States Patent
Segawa

(10) Patent No.: US 8,785,302 B2
(45) Date of Patent: Jul. 22, 2014

(54) CRYSTAL SILICON FILM FORMING METHOD, THIN-FILM TRANSISTOR AND DISPLAY DEVICE USING THE CRYSTAL SILICON FILM

(75) Inventor: Yasuo Segawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 255 days.

(21) Appl. No.: 13/408,320

(22) Filed: Feb. 29, 2012

(65) Prior Publication Data
US 2012/0161143 A1 Jun. 28, 2012

Related U.S. Application Data

(63) Continuation of application No. PCT/JP2010/005073, filed on Aug. 17, 2010.

(30) Foreign Application Priority Data

Sep. 17, 2009 (JP) ................. 2009-216233

(51) Int. Cl.
*H01L 21/20* (2006.01)
(52) U.S. Cl.
USPC ............... 438/479; 438/149; 257/59; 257/57; 257/E33.053; 257/E21.09; 257/E29.291
(58) Field of Classification Search
CPC .............. H01L 21/20; H01L 21/02532; H01L 21/0254; H01L 21/0262
USPC .............. 438/479, 179; 257/59, 57, E33.053, 257/E21.09, E29.291
See application file for complete search history.

(56) References Cited

U.S. PATENT DOCUMENTS

| 6,506,635 B1 | 1/2003 | Yamazaki et al. |
| 6,767,799 B2 | 7/2004 | Shimomura et al. |

(Continued)

FOREIGN PATENT DOCUMENTS

| JP | 11-281943 | 10/1999 |
| JP | 2000-299470 | 10/2000 |

(Continued)

OTHER PUBLICATIONS

U.S. Appl. No. 13/338,816 to Yuta Sugawara, filed Dec. 28, 2011.

*Primary Examiner* — Timor Karimy
(74) *Attorney, Agent, or Firm* — Greenblum & Bernstein, P.L.C.

(57) ABSTRACT

A crystal silicon film forming method according to the present invention includes: forming a metal film; forming an insulating film on the metal film, and forming a crystal silicon film made of polycrystal Si on the insulating film. In the forming of an insulating film, the insulating film is formed within a film thickness range of 160 nm to 190 nm. The forming of a crystal silicon film includes forming an amorphous silicon film made of a-Si on the insulating film, within a film thickness range of 30 nm to 45 nm, and forming the crystal silicon film from the amorphous silicon film by irradiating the amorphous silicon film with a light of a green laser.

14 Claims, 48 Drawing Sheets

(56) References Cited

U.S. PATENT DOCUMENTS

| | | |
|---|---|---|
| 6,849,482 B2 | 2/2005 | Yamazaki et al. |
| 7,176,042 B2 | 2/2007 | Shimomura et al. |
| 7,629,208 B2 | 12/2009 | Arai et al. |
| 7,736,917 B2 | 6/2010 | Shimomura et al. |
| 2003/0109085 A1 | 6/2003 | Yamazaki et al. |
| 2003/0180992 A1 | 9/2003 | Shimomura et al. |
| 2004/0248347 A1 | 12/2004 | Shimomura et al. |
| 2005/0092998 A1 | 5/2005 | Yamazaki et al. |
| 2007/0141733 A1 | 6/2007 | Shimomura et al. |
| 2008/0142800 A1 | 6/2008 | Arai et al. |
| 2010/0038646 A1 | 2/2010 | Arai et al. |
| 2011/0318891 A1 | 12/2011 | Oda et al. |

FOREIGN PATENT DOCUMENTS

| | | |
|---|---|---|
| JP | 2000-323407 | 11/2000 |
| JP | 2001-297984 | 10/2001 |
| JP | 2003-257863 | 9/2003 |
| JP | 2007-012652 | 1/2007 |
| JP | 2007-220918 | 8/2007 |
| JP | 2007-305701 | 11/2007 |
| JP | 2009-111179 | 5/2009 |

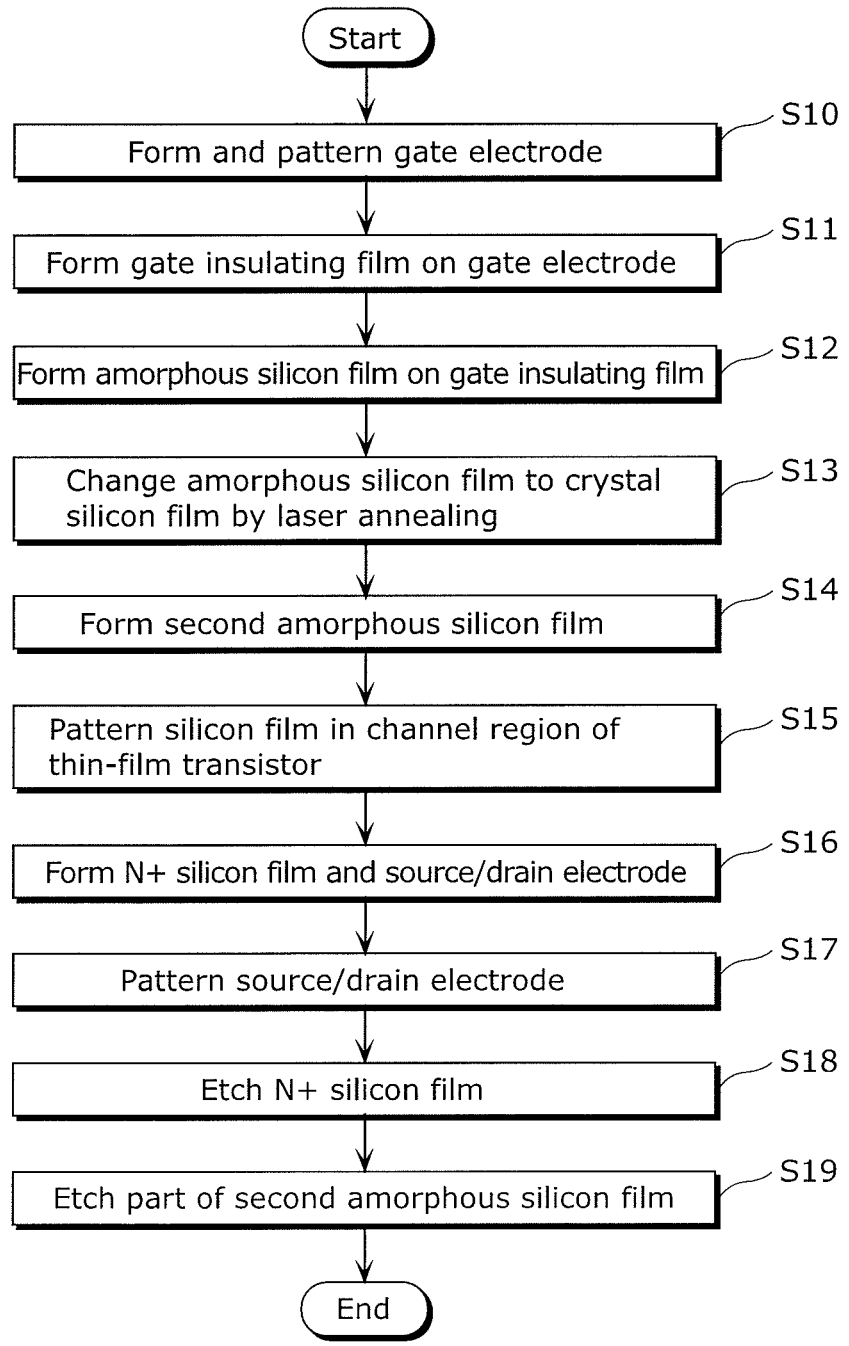

FIG. 7B

|  | Film thickness | Refraction index n + ik (532 nm) |
|---|---|---|
| a-Si | Variable | 4.46 + 0.969i |
| SiO$_2$ | Variable | 1.46 + 0i |
| SiN | — | 1.9 + 0i |
| Mo | Not set | 3.79 + 3.61i |

Light source: 532 nm

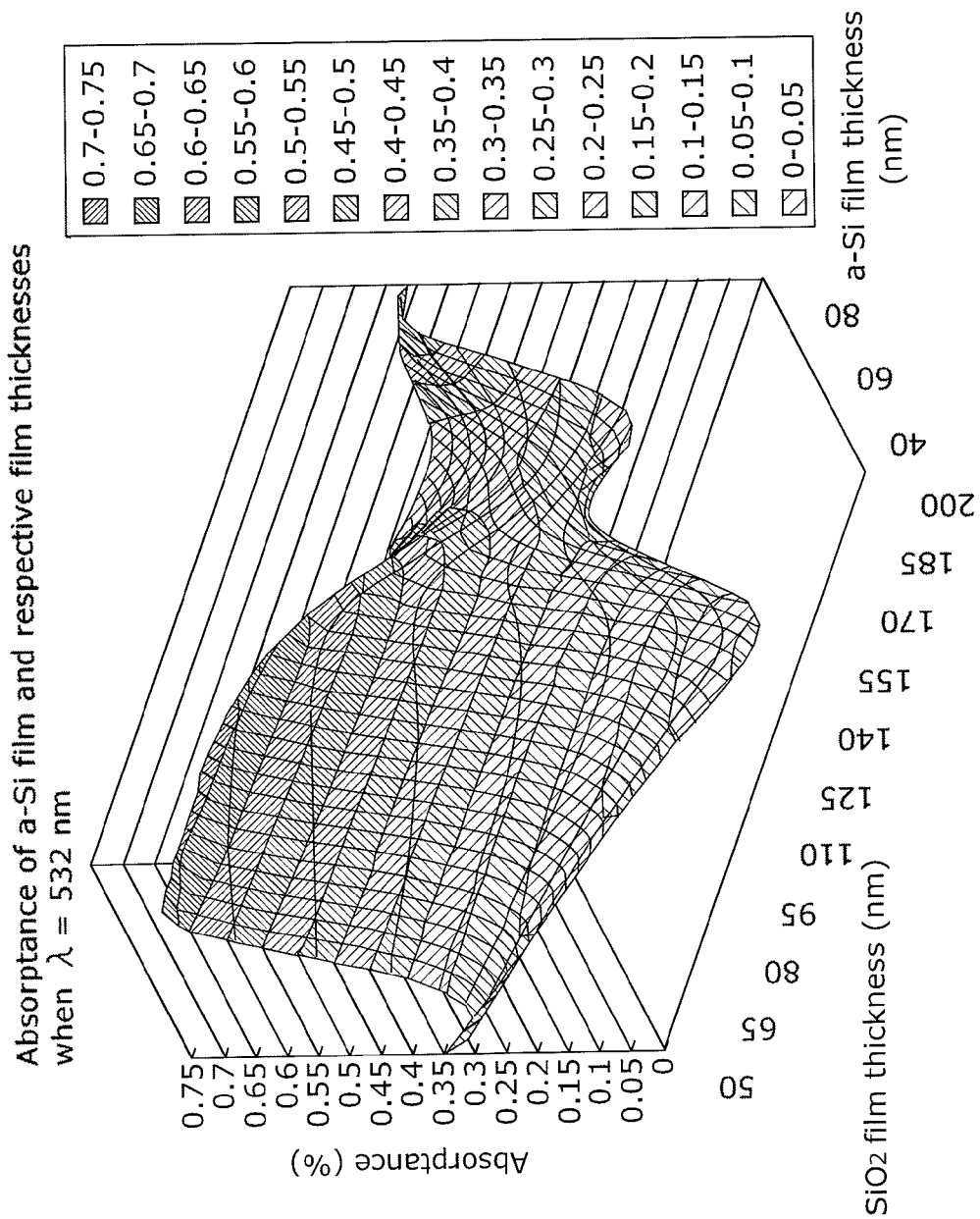

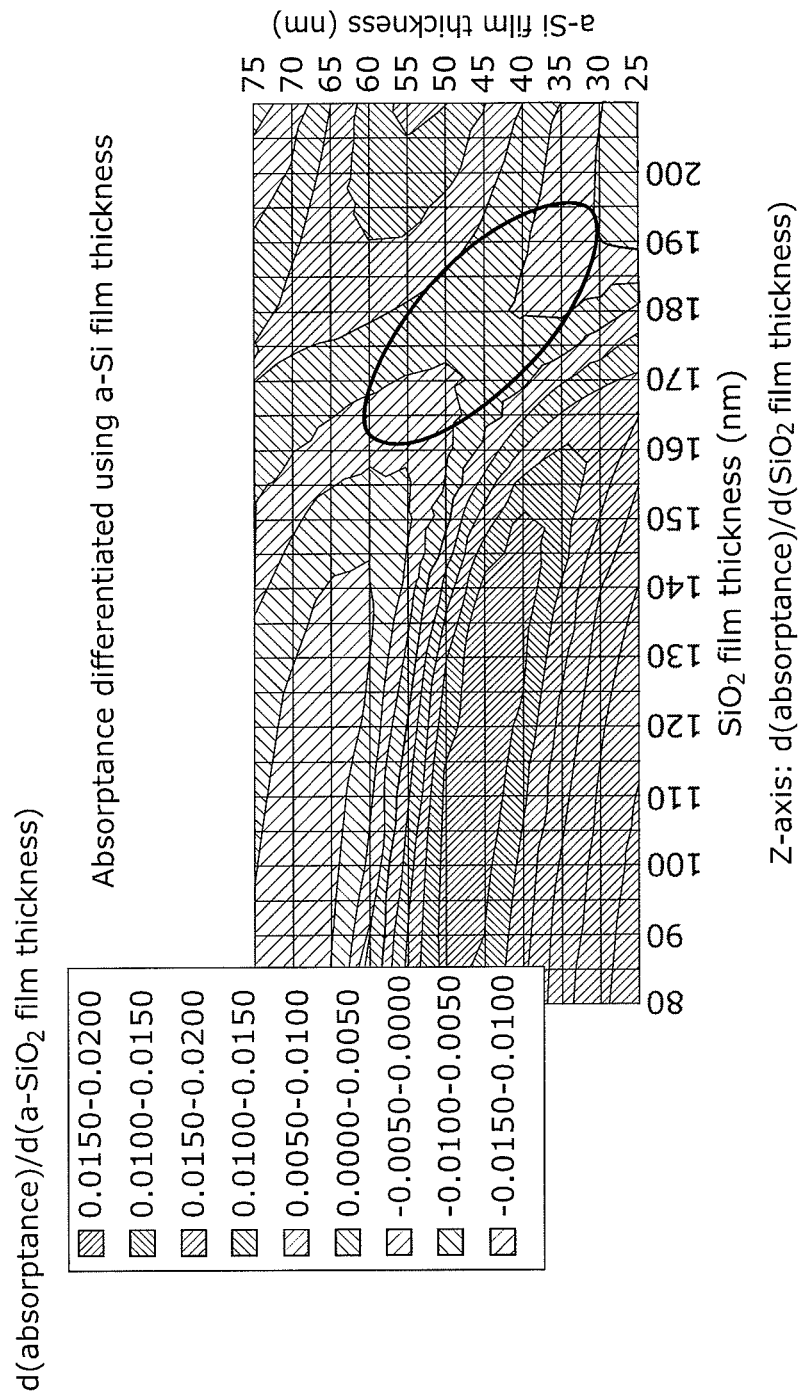

|    | Refraction index (532 nm) | |
|----|------|------|
|    | n    | K    |
| Mo | 3.79 | 3.61 |
| Al | 0.867 | 6.42 |
| Cu | 1.04 | 2.59 |
| W  | 3.48 | 2.72 |

|        | Mo   |      | a-Si |        |
|--------|------|------|------|--------|
|        | n    | K    | n    | K      |
| 308 nm | 3.01 | 3.51 | 2.87 | 3.06   |
| 406 nm | 3.03 | 3.22 | 4.38 | 2.02   |
| 532 nm | 3.79 | 3.61 | 4.46 | 0.969  |
| 808 nm | 3.53 | 3.3  | 3.86 | 0.0812 |

FIG. 20C

| SiN set value | a-Si central value | SiO₂ central value | Absorptance | a-Si film thickness for absorptance ±3% | | SiO₂ film thickness for absorptance ±3% | |
|---|---|---|---|---|---|---|---|
| 30 nm | 35 nm | 160 nm | 32.3 % | −9 nm (25 %) | +10 nm (29 %) | −40 nm (25 %) | +16 nm (10 %) |
| | | | Relative value → | −4.7 nm (13 %) | +6.5 nm (19 %) | −6.0 nm (4 %) | +6.0 nm (4 %) |

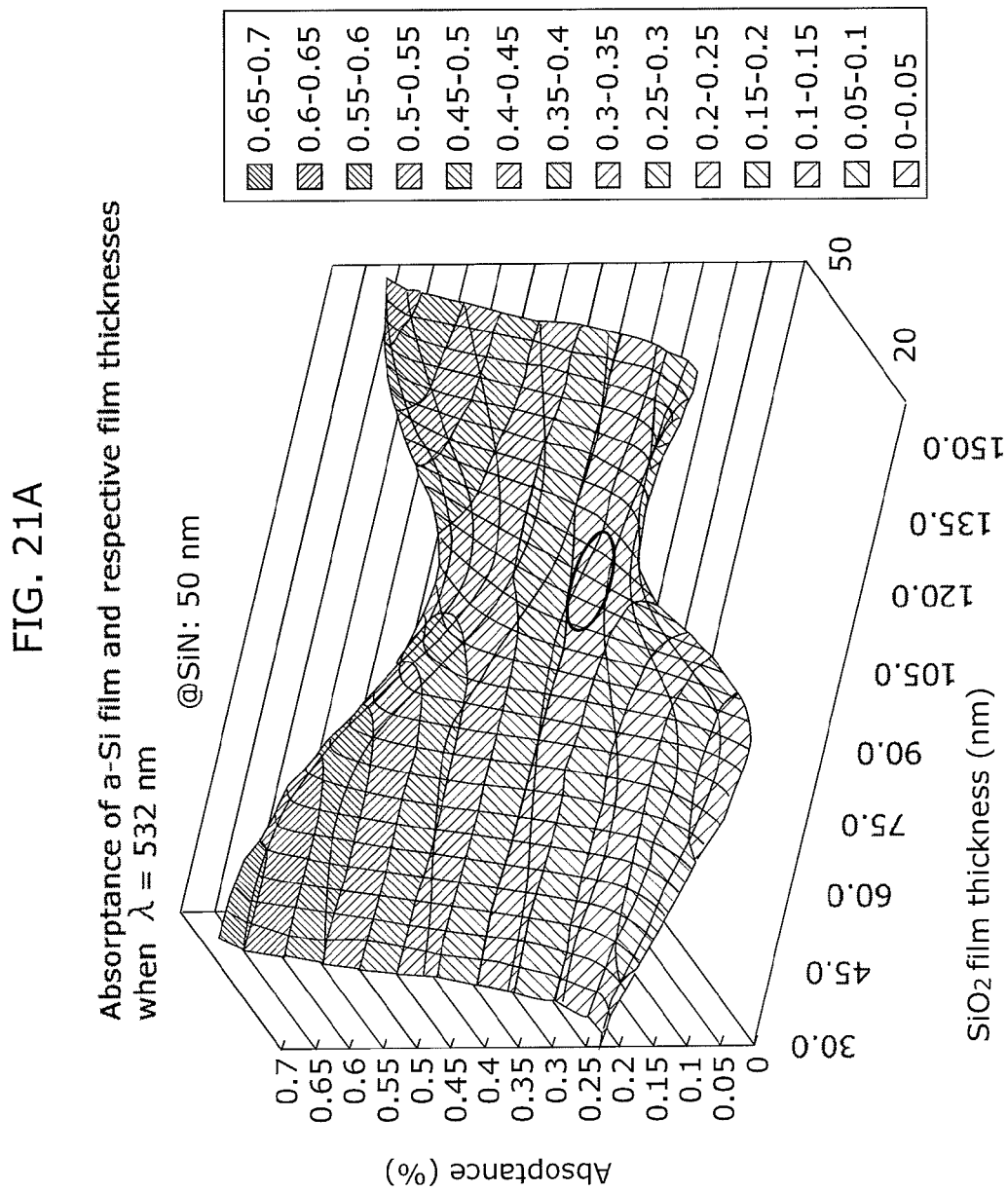

FIG. 21C

| SiN set value | a-Si central value | SiO₂ central value | Absorptance | | a-Si film thickness for absorptance ±3% | | SiO₂ film thickness for absorptance ±3% | |
|---|---|---|---|---|---|---|---|---|
| 50 nm | 35 nm | 125 nm | 31.6 % | | -23 nm (65 %) | +9 nm (26 %) | -28 nm (22 %) | +28 nm (22 %) |
| | | | | Relative value → | -10.5 nm (30 %) | +4.5 nm (13 %) | -21.7 nm (17 %) | +8.8 nm (7 %) |

FIG. 22C

| SiN set value | a-Si central value | SiO₂ central value | Absorptance | a-Si film thickness for absorptance ±3% | | SiO₂ film thickness for absorptance ±3% | |
|---|---|---|---|---|---|---|---|
| 70 nm | 35 nm | 85 nm | 32.2 % | −17 nm (49 %) | +9 nm (26 %) | −22 nm (26 %) | +28 nm (33 %) |
| | | | Relative value → | −10.5 nm (30 %) | +4.1 nm (12 %) | −15.2 nm (18 %) | +10 nm (12 %) |

FIG. 23C

| SiN set value | a-Si central value | SiO₂ central value | Absorptance | | a-Si film thickness for absorptance ±3% | | SiO₂ film thickness for absorptance ±3% | |
|---|---|---|---|---|---|---|---|---|
| 90 nm | 35 nm | 65 nm | 32.5 % | | −8 nm (23 %) | +10 nm (29 %) | −35 nm (54 %) | +20 nm (31 %) |
| | | | | Relative value → | −4.3 nm (12 %) | +6.8 nm (19 %) | −5.7 nm (9 %) | +5.7 nm (9 %) |

| SiN set value | a-Si central value | SiO$_2$ central value | NSiN × dSiN + NSiO$_2$ × dSiO$_2$ |
|---|---|---|---|
| 0 | 40 nm | 180 nm | 263 nm |
| 30 nm | 35 nm | 150 nm | 276 nm |
| 50 nm | 35 nm | 125 nm | 277 nm |
| 70 nm | 35 nm | 90 nm | 264 nm |
| 80 nm | 35 nm | 80 nm | 269 nm |

# CRYSTAL SILICON FILM FORMING METHOD, THIN-FILM TRANSISTOR AND DISPLAY DEVICE USING THE CRYSTAL SILICON FILM

CROSS REFERENCE TO RELATED APPLICATIONS

This is a continuation application of PCT Patent Application No. PCT/JP2010/005073 filed on Aug. 17, 2010, designating the United States of America, which is based on and claims priority of Japanese Patent Application No. 2009-216233 filed on Sep. 17, 2009. The entire disclosures of the above-identified applications, including the specifications, drawings and claims are incorporated herein by reference in their entirety.

BACKGROUND OF THE INVENTION (1) Field of the Invention

The present invention relates to a crystal silicon film forming method and to a thin-film transistor and display device which use the crystal silicon film.

(2) Description of the Related Art

For example, there are thin-film transistors (TFTs) included in liquid-crystal panels or organic electroluminescence (EL) panels. A channel portion of a TFT is formed from a-Si which is amorphous silicon or poly-Si which is polysilicon. The poly-Si of the channel portion of the TFT is typically formed by forming a-Si and subsequently irradiating the a-Si with a laser light such as excimer and the like to instantaneously raise the temperature of the a-Si to thereby crystallize the a-Si.

Furthermore, as TFT structures, there is the bottom-gate structure in which the gate metal is disposed on the substrate-side as seen from the x-Si ("x" is either "a" or "poly") of the channel portion, and the top-gate structure in which the gate metal and source/drain metal are arranged in the opposite direction as the substrate as seen from the x-Si of the channel region. The bottom-gate structure is mainly used in an a-Si TFT which has a channel portion formed from a-Si, and the top-gate structure is mainly used in a poly-Si TFT which has a channel structure formed from poly-Si.

In addition, there are also cases where a poly-Si TFT has the bottom-gate structure, and this has the advantage of keeping down fabrication cost. In such a poly-Si TFT having the bottom-gate structure, poly-Si is formed by performing crystallization by irradiating a-Si with a laser.

However, the gate metals, for example, a gate insulating film of $SiO_2$ film and an a-Si film, are formed using methods such as sputtering and CVD, and perfectly uniform forming thereof is not possible, apparatus-wise. Specifically, the gate metals, namely, the gate insulating film and the a-Si film, included in the poly-Si TFT are formed with a certain degree of unevenness in film thickness. As such, when crystallization is performed by irradiating the a-Si film formed in the above manner with a laser, unevenness in the film quality of the poly-Si TFT film is generated, and defects arise in a display device such as a liquid crystal panel or an organic EL panel configured using the poly-Si TFT.

In response to this, there is disclosed a technique of suppressing the variance in film quality of a poly-Si film occurring when an a-Si film formed using a method such as sputtering or CVD is irradiated with a laser for crystallization into a poly-Si film (for example, Patent Reference 1: Japanese Unexamined Patent Application Publication No. 2001-297984).

In Patent Reference 1, the a-Si film is formed within an optimal film thickness range to thereby suppress the variance in film quality of a poly-Si TFT film with respect to the unevenness of the a-Si film thickness. Here, the light source of the laser used is typically a XeCl excimer laser, and argon lasers and KrF are also included.

Furthermore, Patent Reference 1 discloses a poly-Si TFT, and, when an a-Si film is irradiated with the laser so as to be crystallized to form a poly-Si film, a metal gate electrode is present in a layer lower than the a-Si film, with an insulating film disposed therebetween.

SUMMARY OF THE INVENTION

However, in the method disclosed in Patent Reference 1, there is the problem that, when a laser having a wavelength in the visible light region is used as the light source of the laser, unevenness arises in the characteristics of the poly-Si TFT that is formed, and thus defects occur in the display device configured from the poly-Si TFT. This is described below.

When an excimer laser, for example, is used as a laser light source, the majority of the light at the time of irradiation is absorbed by the a-Si film such that the light hardly permeates up to the metal gate in the layer lower than the a-Si, and thus problems such as those described above occur.

In contrast, when a laser having a wavelength in the visible light region is used as a laser light source, the light that is transmitted past the a-Si film at the time of laser irradiation reflects off the gate metal and causes interference. Specifically, a part of the light that is transmitted past the a-Si film at the time of laser irradiation is absorbed by the gate metal, another part is reflected off the Si film and causes interference, and only the remaining part is absorbed by the a-Si film. Here, the poly-Si film is formed when the energy of the laser light absorbed by the a-Si film causes the temperature of the a-Si film to rise and thereby crystallize the a-Si film.

Specifically, when a laser having a wavelength in the visible light region is used as a laser light source, interference of light in the case where a laser light is emitted occurs in the a-Si film and the underlying layer of the insulating film. As such, when there is unevenness in the film thickness of these films (a-Si film and insulating film) within a substrate or between substrates, the energy absorbed by the a-Si film is different even though the laser is emitted with the same energy. As a result, unevenness is generated in the crystallinity of the crystallized Si film. This causes unevenness in the characteristics of the fabricated poly-Si TFT, and defects occur in display devices configured from the poly-Si TFT, such as the displaying panel not displaying uniformly and so on.

Thus, the present invention is conceived in view of the above problem point and has as an object to provide a crystal silicon film forming method of forming a crystal silicon film having stable characteristics, as well as a thin-film transistor and display device which use the crystal silicon film.

In order to achieve the aforementioned object, a crystal silicon film forming method according to an aspect of the present invention includes: forming a metal film; forming an insulating film on the metal film, and forming a crystal silicon film made of polycrystal Si on the insulating film, wherein in the forming of an insulating film, the insulating film is formed within a film thickness range of 160 nm to 190 nm, and the forming of a crystal silicon film includes forming an amorphous silicon film made of a-Si on the insulating film, within a film thickness range of 30 nm to 45 nm, and forming the crystal silicon film from the amorphous silicon film by irradiating the amorphous silicon film with a light of a green laser.

With this, it is possible to realize a crystal silicon film forming method of forming a crystal silicon film having stable characteristics, using a laser having a wavelength in the visible light region.

It should be noted that, by differentiating the (light) absorptance of the a-Si film and extracting the film thickness range in which absorptance variation is minimal, it is possible to define a film thickness range (a certain allowable range) for each of the a-Si film and the insulating film, which is a base film of the a-Si film, in which the effects of film thickness fluctuation on the absorptance of the a-Si film is minimal. Normally, when the a-Si film and the insulating film which is the base film thereof are formed by CVD, film thickness fluctuates by approximately ±10 percent. However, when the a-Si film and the insulating film which is the base film thereof are formed within the aforementioned film thickness range, it is possible to perform crystallization with the effects of film thickness fluctuation in the laser crystallization process being suppressed.

According to the present invention, it is possible to realize: a crystal silicon film forming method of forming a crystal silicon film having stable characteristics, using a laser having a wavelength in the visible light region; a thin-film transistor manufacturing method; a thin-film transistor; and a display device.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings:

FIG. 3 is a flowchart showing a manufacturing process of the thin-film transistor of the organic light-emitting display device according to the first embodiment of the present invention.

FIG. 7B is a table showing the model structure used in the calculations in an Example and the parameters thereof;

FIG. 9A is a graph showing calculation results in the case where the a-Si film thickness and the $SiO_2$ film thickness are changed;

FIG. 9D is a graph showing calculation results in the case where the a-Si film thickness and the $SiO_2$ film thickness are changed;

FIG. 20C is a graph showing calculation results when the a-Si film thickness and the $SiO_2$ film thickness are changed in the case where the film thickness of the SiN film is fixed at 30 nm;

FIG. 21A is a graph showing calculation results when the a-Si film thickness and the $SiO_2$ film thickness are changed in the case where the film thickness of the SiN film is fixed at 50 nm;

FIG. 21C is a graph showing calculation results when the a-Si film thickness and the $SiO_2$ film thickness are changed in the case where the film thickness of the SiN film is fixed at 50 nm;

FIG. 22C is a graph showing calculation results when the a-Si film thickness and the $SiO_2$ film thickness are changed in the case where the film thickness of the SiN film is fixed at 70 nm;

FIG. 23C is a graph showing calculation results when the a-Si film thickness and the $SiO_2$ film thickness are changed in the case where the film thickness of the SiN film is fixed at 90 nm;

DESCRIPTION OF THE PREFERRED EMBODIMENTS

Hereinafter, embodiments of the present invention shall be described with reference to the Drawings.

(First Embodiment)

Hereinafter, an example of a first embodiments of the present invention shall be described with reference to the Drawings.

Figure 1:
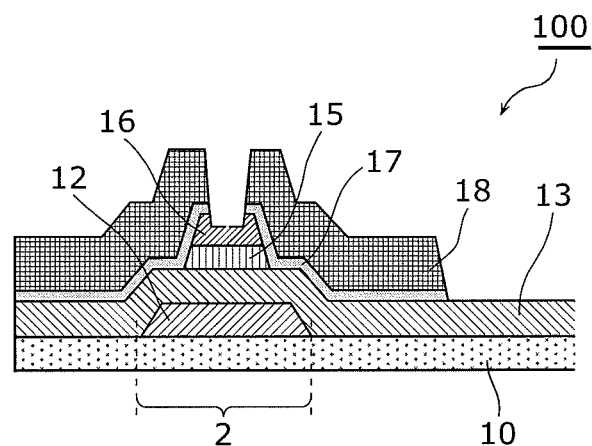
FIG. 1 is a cross-sectional view of a structure of a thin-film transistor included in an organic light-emitting display device according to a first embodiment of the present invention.

FIG. 1 is a cross-sectional view of a structure of a thin-film transistor included in an organic light-emitting display device according to the first embodiment of the present invention. FIG. 1 shows a cross-sectional view of a thin-film transistor 100 constituting a drive transistor 2, for example.

As shown in FIG. 1, the thin-film transistor 100 has the bottom-gate structure and includes an insulating substrate 10, a gate electrode 12, a gate insulating film 13, a crystal silicon film 15, an amorphous silicon film 16, an n+ silicon film 17, and a source/drain electrode 18.

The insulating substrate 10 is a substrate made of transparent glass or quartz.

The gate electrode 12 is formed on the insulating substrate 10, and is typically made of a refractory metal such as molybdenum (Mo). It should be noted that the gate electrode 12 may be formed by an alloy with another metal such as molybdenum-tungsten (MoW). Furthermore, the gate electrode 12 may be formed from aluminum (Al), copper (Cu), or tungsten (W), and may be formed using an Al alloy or a Cu alloy.

The gate insulating film 13 is formed so as to cover the gate electrode 12, and is typically made of a silicon oxide ($SiO_2$). Furthermore, the film thickness of the gate insulating film 13 is preferably from 160 nm to 190 nm. It should be noted that the gate insulating film 13 may be formed from a stacked structure of a silicon oxide ($SiO_x$) and a silicon nitride ($SiN_x$).

The crystal silicon film 15 is formed on the gate insulating film 13, and is typically made of polysilicon, in other words, poly-Si. The crystal silicon film 15 is formed by forming an amorphous silicon film 14 (not shown in the figure) made of a-Si on the gate insulating film and polycrystallizing (including microcrystallization) the amorphous silicon film 14 by laser irradiation.

Here, polycrystal refers not only to a polycrystal in the narrow sense which is made of crystals of at least 50 nm, but to a broad meaning which includes microcrystal which in the narrow sense is made of crystals of less than 50 nm. Hereinafter, polycrystal shall be described in reference to the broad meaning.

It should be noted that the laser light source used in the laser irradiation is a laser having a wavelength in the visible light region. A laser having a wavelength in the visible light region is a laser having a wavelength of approximately 380 nm to 780 nm, and is preferably a green laser having a wavelength of 500 nm to 560 nm. Furthermore, the amorphous silicon film 14 is made of amorphous silicon, that is, a-Si, and is formed, preferably with a film thickness of 30 nm to 45 nm, on the gate insulating film 13.

The amorphous silicon film 16 is formed on the crystal silicon film 15 left over from the patterning. In this manner, the thin-film transistor 100 constituting the drive transistor 2 includes a channel layer having a structure in which the amorphous silicon film 16 is stacked on the crystal silicon film 15.

The n+ silicon film 17 is formed so as to cover the sides of the amorphous silicon film 16 and crystal silicon film 15, and the gate insulating film 13.

The source/drain electrode 18 is formed on the n+ silicon film 17 and is made of a metal such as molybdenum (Mo) or an Mo alloy, a metal such as titanium (Ti), aluminum (Al), or an Al alloy, a metal such as copper (Cu) or a Cu alloy, or a metal such as silver (Ag), chromium (Cr), tantalum (Ta), or tungsten (W).

Thus, the thin-film transistor 100 is configured as described above.

Thus, the thin-film transistor 100 of the organic light-emitting display device according to the first embodiment of the present invention is configured as described above.

Figure 2:
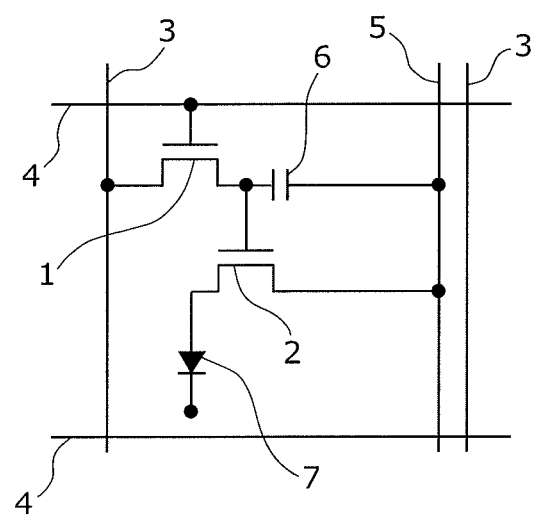
FIG. 2 is diagram showing an equivalent circuit of the organic light-emitting display device according to the first embodiment of the present invention.

FIG. 2 is diagram showing an equivalent circuit of the organic light-emitting display device according to the first embodiment of the present invention. The organic light-emitting display device shown in FIG. 2 includes a switching transistor 1, a drive transistor 2, a data line 3, a scanning line 4, a current supply line 4, a capacitor 6, and an organic EL element 7.

The switching transistor 1 is connected to the data line 3, the scanning line 4, and the capacitor 6.

The drive transistor 2 is connected to the current supply line 5, the capacitor 6, and the organic EL element 7.

The data line 3 is a line for transmitting, to the pixel of the organic EL element 7, data (size of a voltage value) which determines the brightness of the pixel of the organic EL element 7.

The scanning line 4 is a line for transmitting, to the pixel of the organic EL element 7, data which determines the switch (ON/OFF) of the pixel of the organic EL element 7.

The current supply line 5 is a line for supplying a large current to the drive transistor 2.

The capacitor 6 holds a current value (electric charge) for a certain length of time.

Thus, the organic light-emitting display device in the first embodiment is configured as described above.

Next, the manufacturing method shall be described.

FIG. 3 is a flowchart showing the manufacturing process of the thin-film transistor of the organic light-emitting display device according to the first embodiment of the present invention. FIG. 4A to FIG. 4J are diagrams for describing the method of manufacturing the thin-film transistor of the organic light-emitting display device according to the first embodiment of the present invention. FIG. 5 is a diagram schematically showing laser annealing in S13 in FIG. 3.

First, the forming and patterning of the gate electrode 12 is performed (S10).

Figure 4A:
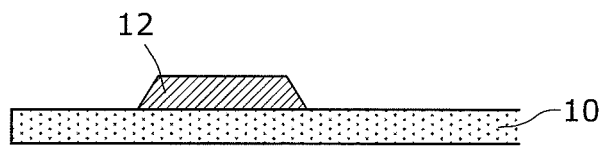
FIG. 4A is a cross-sectional view for describing a method of manufacturing the thin-film transistor of the organic light-emitting display device according to the first embodiment of the present invention.
Figure 4B:
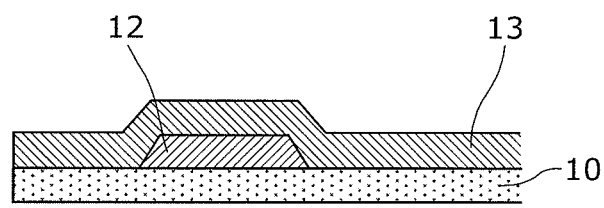
FIG. 4B is a cross-sectional view for describing the method of manufacturing the thin-film transistor of the organic light-emitting display device according to the first embodiment of the present invention.
Figure 5:
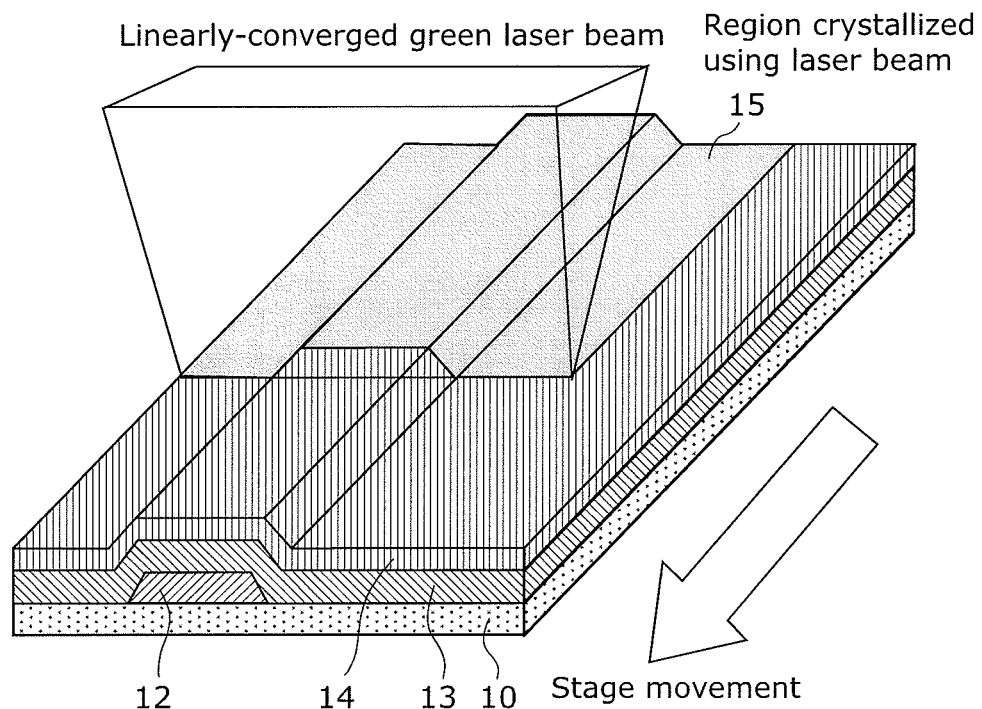
FIG. 5 is a diagram schematically showing laser annealing in S13 in FIG. 3.

Specifically, the metal which is to become the gate electrode 12 is deposited on the insulating substrate 10 by sputtering, and the gate electrode 12 of the thin-film transistor 100 is formed by photolithography and etching (FIG. 4A). Here, the gate electrode 12 is typically formed from a refractory metal material such as Mo (molybdenum). It should be noted that the gate electrode 12 may be formed from an alloy with another metal such as MoW, for example. Furthermore, the gate electrode 12 may be formed from Al, Cu, or W, and may be formed using an Al alloy or a Cu alloy.

Next, the gate insulating film 13 is formed on the gate electrode 12 (S11), and the amorphous silicon film 14 is formed on the gate insulating film 13 (S12).

Figure 4C:
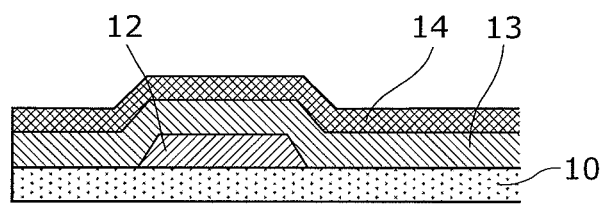
FIG. 4C is a cross-sectional view for describing the method of manufacturing the thin-film transistor of the organic light-emitting display device according to the first embodiment of the present invention.

Specifically, the gate insulating film 13 is formed above the gate electrode 12, that is, to cover the insulating substrate 10 and the gate electrode (FIG. 4B), and the amorphous silicon film 14 is successively formed on the formed gate insulating film 13 (FIG. 4C). Here, the gate insulating film 13 is made of a silicon oxide ($SiO_2$), and the film thickness of the gate insulating film 13 is preferably from 160 nm to 190 nm. Furthermore, the amorphous silicon film 14 is formed preferably with a film thickness of 30 nm to 45 nm on the gate insulating film 13.

Figure 4D:
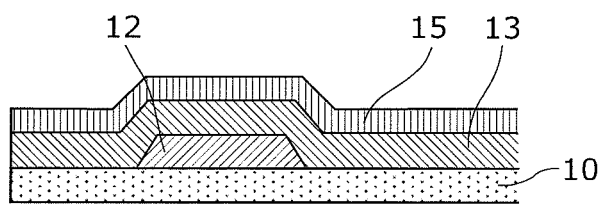
FIG. 4D is a cross-sectional view for describing the method of manufacturing the thin-film transistor of the organic light-emitting display device according to the first embodiment of the present invention.

Next, the amorphous silicon film 14 is made into the crystal silicon film 15 by laser annealing (S13). Specifically, a dehydrogenation treatment is performed on the formed amorphous silicon film 14. Subsequently, the crystal silicon film 15 is formed by making the amorphous silicon film 14 polycrystalline (including microcrystalline) by laser annealing (FIG. 4D).

Here, the laser light source used in the laser irradiation in such laser annealing is a laser having a wavelength in the visible light region. The laser having a wavelength in the visible light region is a laser having a wavelength of approximately 380 nm to 780 nm, and is preferably a green laser having a wavelength of 500 nm to 560 nm. In the process in S13, that is, the processes from FIG. 4C to FIG. 4D, the amorphous silicon film 14 is made into the crystal silicon film 15 by being irradiated with, for example, a green laser light that is linearly converged, as shown in FIG. 5.

Specifically, the emitting position of the linearly-converged green laser light is fixed, and the insulating substrate 10 on which the amorphous silicon film 14 is formed is placed on a stage. The amorphous silicon film 14 is irradiated with green laser light by moving the stage. In this manner, the amorphous silicon film 14 that has been irradiated with the green laser light absorbs the energy of the green laser light which raises the temperature of and crystallizes the amorphous silicon film 14, to thereby become the crystal silicon film 15.

Next, the amorphous silicon film 16, which is the second layer of amorphous silicon film, is formed (S14), and the silicon film layer of the channel region of the thin-film transistor 100 is patterned (S15).

Figure 4E:
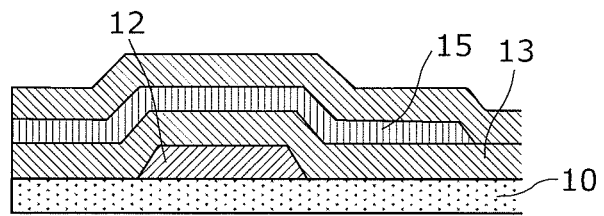
FIG. 4E is a cross-sectional view for describing the method of manufacturing the thin-film transistor of the organic light-emitting display device according to the first embodiment of the present invention.
Figure 4F:
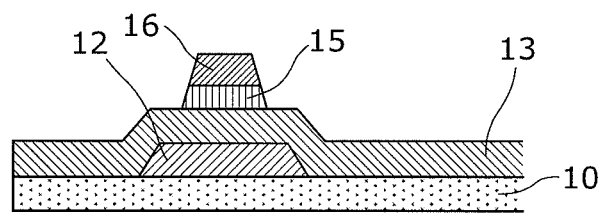
FIG. 4F is a cross-sectional view for describing the method of manufacturing the thin-film transistor of the organic light-emitting display device according to the first embodiment of the present invention.

Specifically, the amorphous silicon film 16, which is the second amorphous silicon film, is formed on the gate insulating film 13 by plasma CVD (FIG. 4E). Subsequently, the silicon film layers (crystal silicon film 15 and amorphous silicon film 16) are patterned so that the channel region of the thin-film transistor 100 remains, and the portions of the amorphous silicon film 16 and the crystal silicon film 15 that should be removed are removed by etching (FIG. 4F). This allows the desired channel layer to be formed in the thin-film transistor 100.

Next, the n+ silicon film 17 and the source/drain electrode 18 are formed (S16).

Figure 4G:
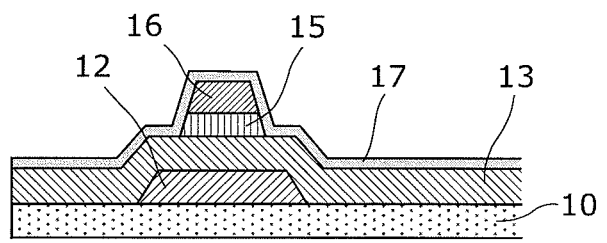
FIG. 4G is a cross-sectional view for describing the method of manufacturing the thin-film transistor of the organic light-emitting display device according to the first embodiment of the present invention.

Specifically, the n+ silicon film 17 is formed by plasma CVD so as to cover the sides of the amorphous silicon film 16 and crystal silicon film 15, and the gate insulating film 13 (FIG. 4G).

Figure 4H:
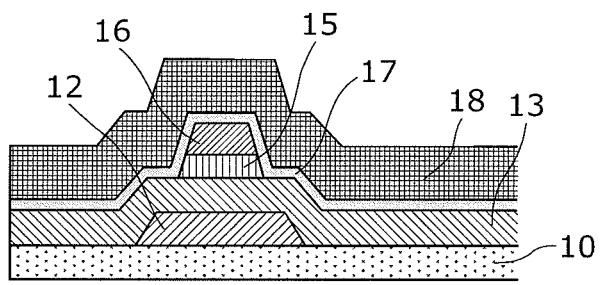
FIG. 4H is a cross-sectional view for describing the method of manufacturing the thin-film transistor of the organic light-emitting display device according to the first embodiment of the present invention.

Then, the metal which is to become the source/drain electrode 18 is deposited on the formed n+ silicon film 17 by sputtering (FIG. 4H). The source/drain electrode formed from a material of a metal such as molybdenum (Mo) or an Mo alloy, a metal such as titanium (Ti), aluminum (Al), or an Al alloy, a metal such as copper (Cu) or a Cu alloy, or a metal such as silver (Ag), chromium (Cr), tantalum (Ta), or tungsten (W).

Next, patterning of the source/drain electrode 18 is performed (S17). Then, the n+ silicon film 17 is etched (S18), and the second layer of the amorphous silicon film 16 is partially etched (S19).

Figure 4I:
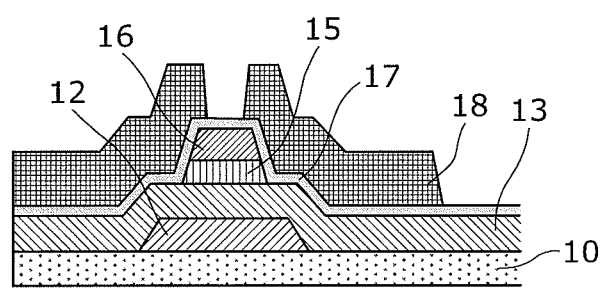
FIG. 4I is a cross-sectional view for describing the method of manufacturing the thin-film transistor of the organic light-emitting display device according to the first embodiment of the present invention.
Figure 4J:
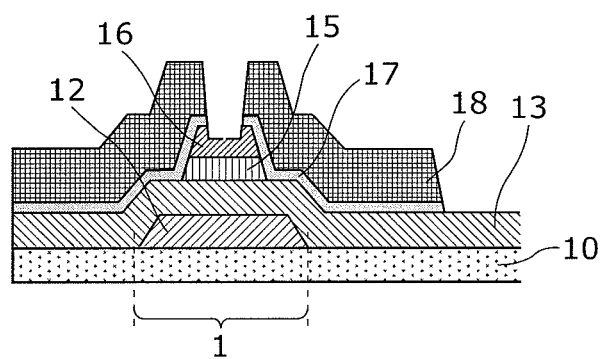
FIG. 4J is a cross-sectional view for describing the method of manufacturing the thin-film transistor of the organic light-emitting display device according to the first embodiment of the present invention.

Specifically, the source/drain electrode 18 is formed by photolithography and etching (FIG. 4I). Furthermore, the n+ silicon film 17 is etched, and the amorphous silicon film 16 of the channel region of the thin-film transistor 100 is partially etched (FIG. 4J). Stated differently, the amorphous silicon film 16 is channel-etched so as to leave behind the part of the amorphous silicon film 16 of the channel region of the thin-film transistor 100.

Thus, the thin-film transistor 100 of the organic light-emitting display device is manufactured as described above.

As described above, the thin-film transistor 100 of the organic light-emitting display device in the first embodiment is formed as a poly-Si TFT having the bottom-gate structure. At the time of manufacturing of the thin-film transistor 100, the gate insulating film 13, which is made of $SiO_2$, is formed on the gate electrode 12 so as to have a film thickness of 160 nm to 190 nm. The amorphous silicon film 14, which is made from an a-Si film, is formed on the gate insulating film 13 so as to have a film thickness of 30 nm to 45 nm. Then, by performing laser annealing (crystallization) on the amorphous silicon film 14 made from an a-Si film, using a green laser for example, the amorphous silicon film 14 is made into the crystal silicon film 15.

In this manner, the gate insulating film 13 and the amorphous silicon film 14 are formed within the corresponding film thickness range described above, at the time of manufacturing of the thin-film transistor 100 of the organic light-emitting display device according to the first embodiment. With this, when the amorphous silicon film 14 is laser annealed (crystallized) using, for example, a green laser, variation in the (light) absorptance of the a-Si film caused by film-thickness fluctuation can be reduced. Specifically, the effects of the unevenness of the film thickness of the amorphous silicon film 14 arising during the forming using CVD are not felt and stable crystallization becomes possible. In addition, it is possible to suppress the unevenness of characteristics of TFTs using the amorphous silicon film 14, and improve the display quality of display devices such as LCDs or OLEDs.

This is because, although the film thickness of the amorphous silicon film 14, which is made of a-Si, and the gate insulating film 13 are important parameters for determining device characteristics, that is, the crystallinity of the crystal silicon film 15, there is a certain allowable range (film thickness range) in forming the crystal silicon film 15 which allows the display device, which is an application product, to realize normal displaying. As such, even when the film thickness of the amorphous silicon film 14 and the gate insulating film 13 fluctuate at the time of forming, as long as each is formed within the corresponding film thickness range, it is possible to reduce the variation in the absorptance of the a-Si film even when crystallization is performed using a laser having a wavelength in the visible light range. Specifically, through the forming of the gate insulating film 13 and the amorphous silicon film 14 in the corresponding film thickness range described above, the variation of the absorptance of the amorphous silicon film 14 due to the variation in the film thickness of the gate insulating film 13 and the amorphous silicon film 14 can be reduced.

It should be noted that although the forgoing description exemplifies crystallization of the amorphous silicon film 14 using a linearly-converged laser light, a spot (including circular, elliptical, and others) laser light may also be used instead for the present invention. In such a case, it is preferable that the irradiation with the laser light be performed using a scanning method suited to crystallization.

Furthermore, in the thin-film transistor 100, it is preferable that the gate electrode be formed from a refractory metal such as Mo or a refractory metal such as MoW (an alloy of Mo and another metal).

Furthermore, in the thin-film transistor 100, the existence of the above-described certain allowable range in the film thickness of the amorphous silicon film 14, which is made of a-Si, and the gate insulating film 13 was found by calculating the absorptance of the a-Si film during irradiation with a green laser (532 nm). This shall be described in detail below as an Example.

EXAMPLE

First, the calculation method shall be described.

FIG. 6A to FIG. 6D are diagrams for describing the amplitude transmittance and the method of calculating the amplitude transmittance.

Figure 6A:
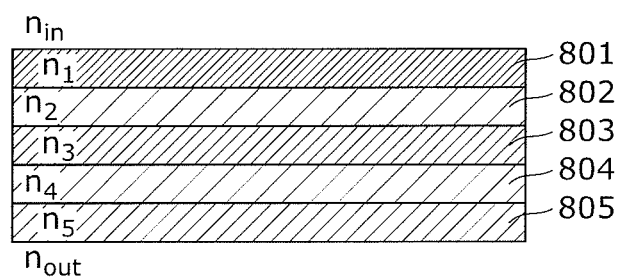
FIG. 6A is a diagram for describing amplitude transmittance and a method of calculating the amplitude transmittance.

FIG. 6A shows a film structure model of a multilayer film structure consisting of five layers.

The film structure model includes a film 801 having a refraction index $n_1$, a film 802 having a refraction index $n_2$, a film 803 having a refraction index $n_3$, a film 804 having a refraction index $n_4$, and a film 805 having a refraction index $n_5$. The film structure model shows a model in which the film 805, the film 804, the film 803, the film 802, and the film 801 are stacked in such order. The region having the refraction index $n_{in}$ in the figure is outside of film structure model and shows the side at which light enters the film structure model.

Likewise, the region having the refraction index $n_{out}$ is outside of film structure model and shows the side at which light exits the film structure model.

Figure 6B:
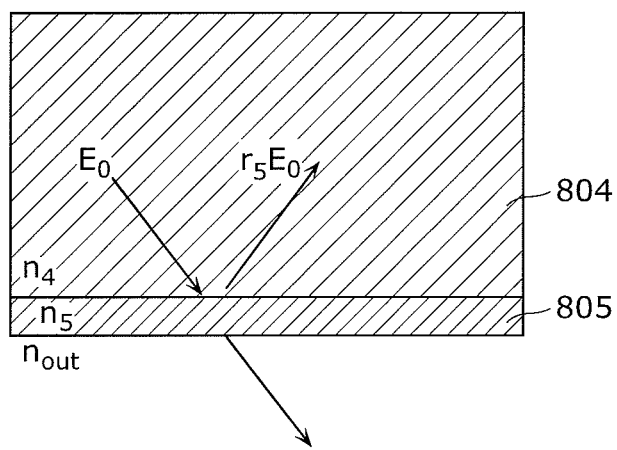
FIG. 6B is a diagram for describing amplitude transmittance and the method of calculating the amplitude transmittance.

As shown in FIG. 6B, the reflectance of the lowest layer of the film structure model, that is, the film 805 is calculated according to Expression 1. It should be noted that, in the figure, $E_0$ denotes the amplitude of the energy of the light incident on the film 805.

[Math. 1]

$$r_5 = \frac{r_{45} + r_{5out}e^{i\Delta_5}}{1 + r_{5out}r_{45}e^{i\Delta_5}}$$ (Expression 1)

Here, $r_5$ denotes the amplitude reflectance of the film 805, and $r_{45}$ denotes the amplitude reflectance from the film 804 to the film 805. $r_{5out}$ denotes the amplitude reflectance from the film 805 to the outside. Furthermore, $\Delta_5$ denotes the optical path length of the film 805.

Figure 6C:
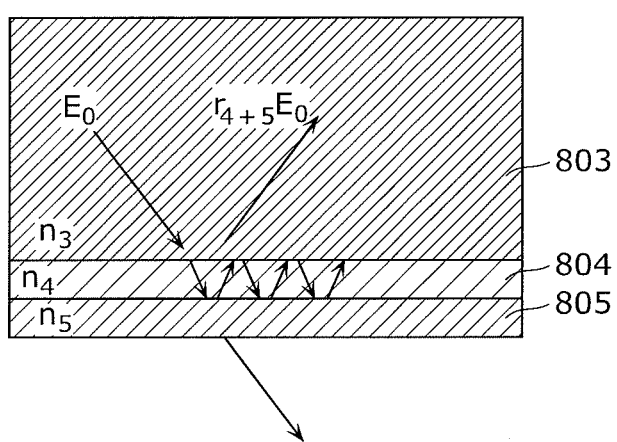
FIG. 6C is a diagram for describing amplitude transmittance and the method of calculating the amplitude transmittance.

In addition, as shown in FIG. 6C the amplitude reflectance in the two layers of the film 805 and the film 804 is calculated according to Expression 2.

[Math. 2]

$$r_{4+5} = \frac{r_{34} + r_5 e^{i\Delta_4}}{1 + r_5 r_{34} e^{i\Delta_4}}$$ (Expression 2)

Here, $r_{4+5}$ denotes the amplitude reflectance when the film 805 and the film 804 are taken as one layer, and $r_{34}$ denotes the amplitude reflectance from the film 803 to the film 804. r5 denotes the amplitude reflectance of the film 805. Furthermore, $\Delta_4$ denotes the optical path length of the film 804.

By repeating such a calculation, the amplitude reflectance of the film structure model of the multilayer film structure consisting of five layers can be calculated as in Expression 3.

[Math. 3]

$$r_{1+2+3+4+5}r_{1+2+3+4+5} = \frac{r_{in1} + r_{2+3+4+5}e^{i\Delta_1}}{1 + r_{2+3+4+5}r_{in1}e^{i\Delta_1}}$$ (Expression 3)

Figure 6D:
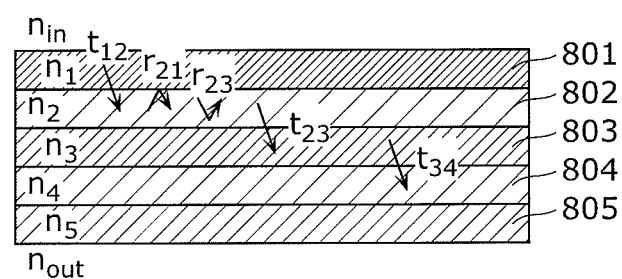
FIG. 6D is a diagram for describing amplitude transmittance and the method of calculating the amplitude transmittance.

Furthermore, the amplitude transmittance can be calculated using the same calculation. Specifically, the amplitude transmittance the two layers of the film 802 and the film 803 shown in FIG. 6D is calculated according to Expression 4.

[Math. 4]

$$t_{1\to3} = t_{12}t_{23}e^{i\Delta/2} \times \frac{1}{1 - r_{23}r_{21}e^{i\Delta}}$$ (Expression 4)

Here, $t_{1\to3}$ denotes the amplitude transmittance when the film 802 and the film 803 are taken as one layer. $t_{12}$ denotes the amplitude transmittance from the film 801 to the film 802, and $t_{23}$ denotes the amplitude transmittance from the film 802 to the film 803. Furthermore, $r_{23}$ denotes the amplitude reflectance from the film 802 to the film 803, and $r_{21}$ denotes the amplitude reflectance from the film 802 to the film 801. $\Delta$ denotes the optical path length.

Next, when the next layer, that is, the film 803 is taken into consideration, the amplitude transmittance of these three layers is calculated, using $t_{1\to3}$, according to Expression 5.

[Math. 5]

$$t_{1\to4} = t_{1\to3}t_{34}e^{i\Delta/2} \times \frac{1}{1 - r_{34}r_{32}e^{i\Delta}}$$ (Expression 5)

By repeating such a calculation, it is possible to calculate the amplitude transmittance as a series (here, a 5-layer film structure model). It should be noted that such a calculation results in a complex number since calculation is carried out using all complex number refraction indices.

Furthermore, power reflectance R and power transmittance T take the sum of the complex conjugate shown in Expression 6 and Expression 7, respectively.

$$R = r \times r^*$$ (Expression 6)

$$T = t \times t^*$$ (Expression 7)

When the above-described power reflectance R and power transmittance T are used, the light absorptance of the film 801 is calculated using the expression below.

$$A(\text{film } 801) = 1 - T - R$$

Figure 7A:
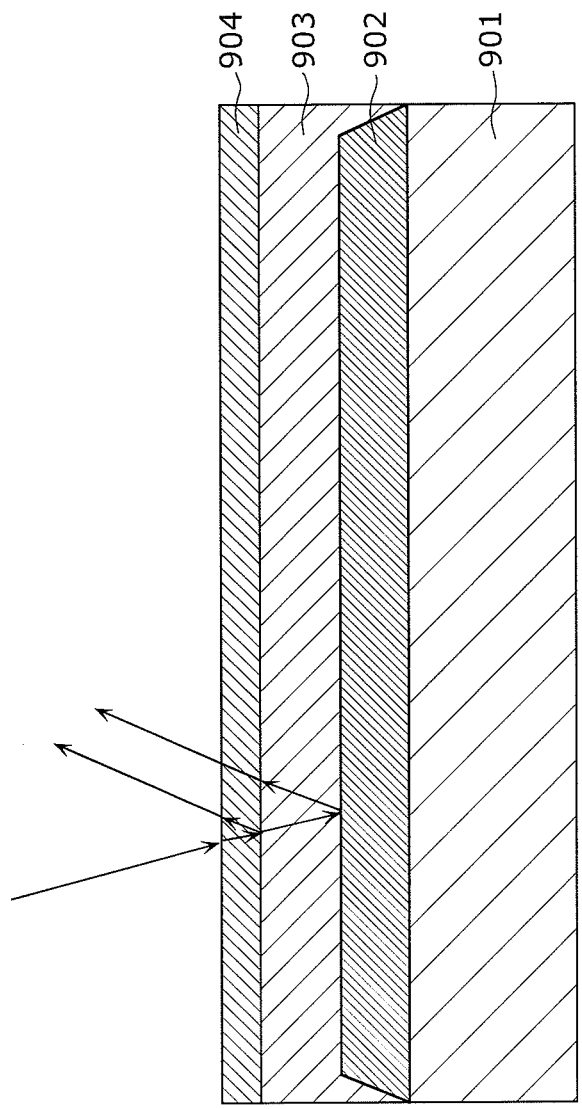
FIG. 7A is a diagram showing a model structure used in the calculations in an Example and parameters thereof.

FIG. 7A and FIG. 7B are diagrams showing the model structure used in the calculations in the present Example and the parameters thereof. Here, k is an attenuation coefficient and is a coefficient leading to the absorption coefficient.

In the model structure shown in FIG. 7A, a glass substrate 901 (no consequence to the calculation) is prepared as a substrate, and a metal film 902 (film thickness not set) made of Mo is disposed on the glass substrate 901. An $SiO_2$ film 903 (variable film thickness) and an a-Si film 904 (variable film thickness) are disposed above the metal film 902. Here, this model structure is a modeling of the bottom-gate structure TFT shown in FIG. 1. Furthermore, the glass substrate 901 corresponds to the insulating substrate 10 shown in FIG. 1, and the metal film 902 corresponds to the gate electrode 12. The $SiO_2$ film 903 corresponds to the gate insulating film 13, and the a-Si film 904 corresponds to the amorphous silicon film 14.

Then, the above-described calculation method is used to calculate the absorptance of the a-Si film that can be calculated according to the multiple beam interference when light having a wavelength of 532 nm is incident perpendicularly on the model structure shown in FIG. 7A. Here, FIG. 7B shows the refraction index for the 532 nm wavelength, and the absorptance of the a-Si film is calculated using the values shown in FIG. 7B.

Figure 8:
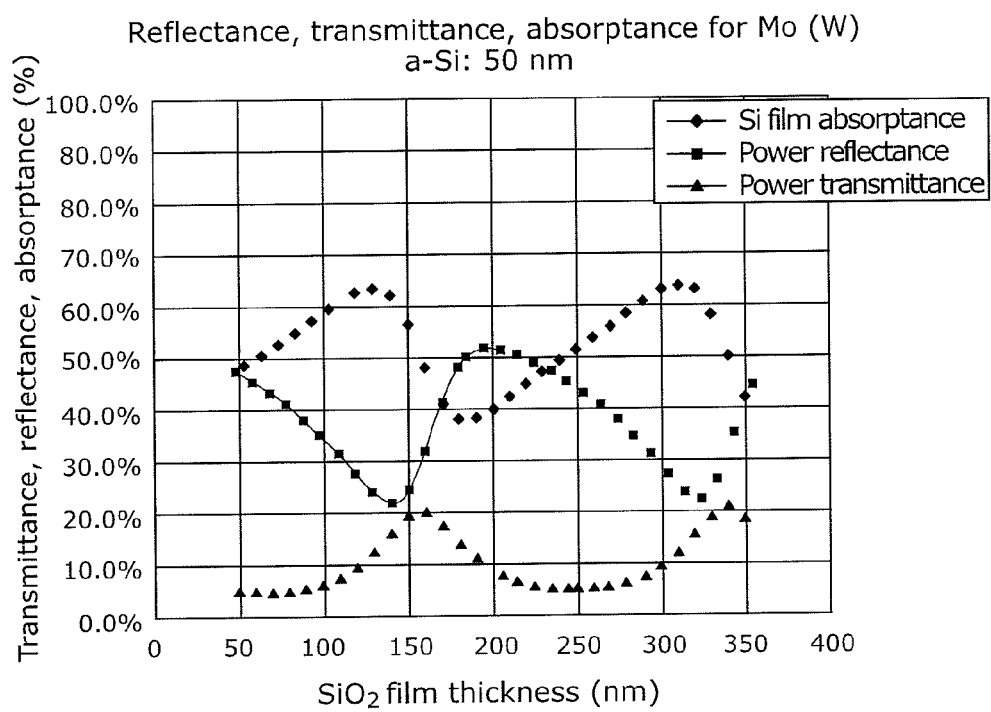
FIG. 8 is a graph showing calculation results when $SiO_2$ film thickness is changed in the case where film thickness of an a-Si film is 50 nm.

FIG. 8 is a graph showing the calculation results when the $SiO_2$ film thickness is changed in the case where the film thickness of the a-Si film is 50 nm. In the calculation result example in FIG. 8, the film thickness of the a-Si film 904 is fixed at 50 nm, and the absorptance of the a-Si film 904, the transmittance and the reflectance of the series as a whole are calculated. At this time, since a-Si and Mo have, for the purpose of calculation, an absorption term (imaginary number term of the refraction index), it is calculated that the portion that is transmitted is absorbed by Mo, and the portion excluding transmission and reflection is absorbed by the a-Si film 904.

As shown in FIG. 8, it can be seen that the absorptance of the a-Si film 904 varies by having a maximum value when the film thickness of the $SiO_2$ film 903 is in the vicinity of 130 nm and having a minimum value when the film thickness of the SiO₂ film 903 is in the vicinity of 180 nm.

Furthermore, the energy absorbed by the metal film 902 which is made of Mo is calculated as the transmittance (power transmittance) for permeating the SiO₂ film 903. It can be seen that this transmittance has a maximum value when the film thickness of the SiO₂ film 903 is in the vicinity of 160 nm. On the other hand, it can be seen that the reflectance (power reflectance) of the series as a whole has a minimum value when the film thickness of the SiO₂ film 903 is in the vicinity of 140 nm and has a maximum value when the film thickness is in the vicinity of 200 nm.

Next, this calculation is performed with the film thickness of the a-Si film 904 being changed.

Figure 9B:
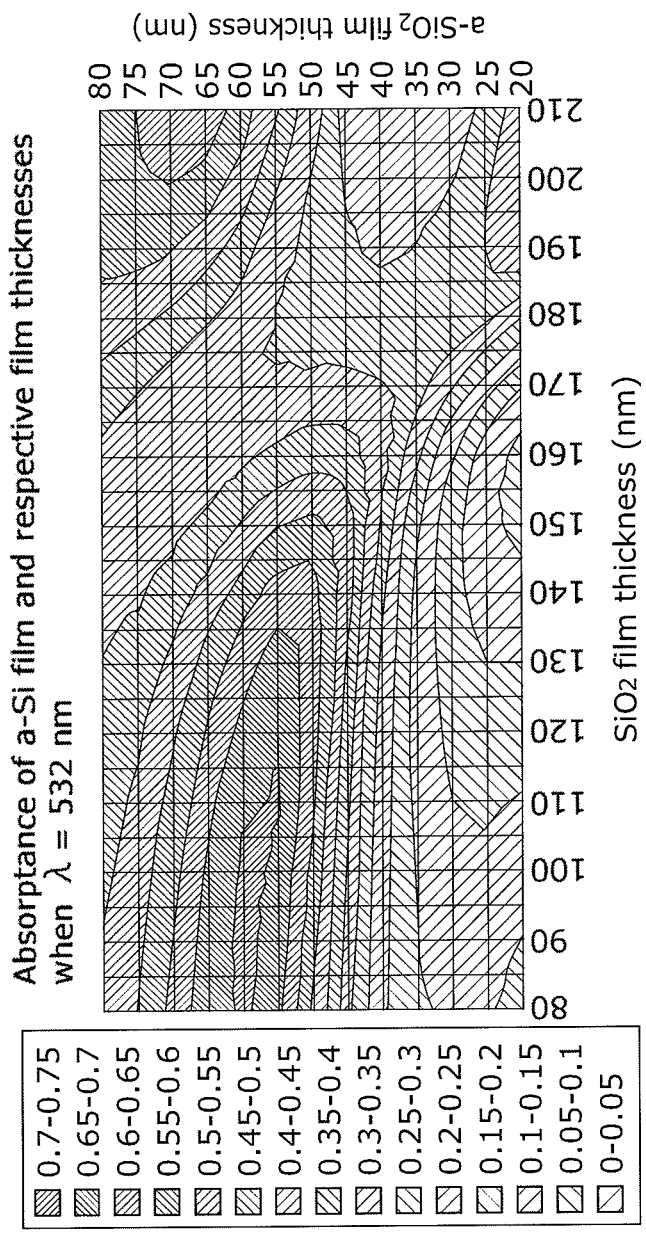
FIG. 9B is a graph showing calculation results in the case where the a-Si film thickness and the $SiO_2$ film thickness are changed.

FIG. 9A to FIG. 9E are graphs showing calculation results in the case where the a-Si film thickness and the SiO₂ film thickness are changed. FIG. 9A is a three-dimensional graph of calculation results in the case where the a-Si film thickness and the SiO2 film thickness are changed, and FIG. 9B is a contour map of the calculation results in the case where the a-Si film thickness and the SiO2 film thickness are changed. It should be noted that FIG. 9A and FIG. FIG. 9B respectively correspond to a three-dimensional display and a two-dimensional display of the same results.

As shown in FIG. 9A and FIG. 9B, it can be seen that the absorptance of the a-Si film 904 is highest when the film thickness of the a-Si film 904 is 55 nm to 60 nm and the film thickness of the SiO₂ film 903 is 80 nm to 110 nm. Furthermore, it can be seen that the absorptance of the a-Si film 904 is lowest when the film thickness of the a-Si film 904 is 20 nm and the film thickness of the SiO₂ film 903 is 150 nm to 160 nm. In this manner, it is possible to calculate the absorptance of the a-Si film 904 with respect to combination of the film thickness of the a-Si film 904 and the film thickness of the SiO₂ film 903.

Here, as shown in FIG. 9B, a region in which the change of the absorptance of the a-Si film 904 with respect to the change in the film thickness the SiO₂ film 903 and the a-Si film 904 is gentle, that is, a region in which the film thickness dependency of the absorptance of the a-Si film 904 is minimal is a preferable region.

Specifically, a region in which the film thickness of the a-Si film 904 is 25 nm to 50 nm and the film thickness of the SiO₂ film 903 is 160 nm to 190 nm is a preferable region. In addition, when the SiO₂ film and the a-Si film are formed within the corresponding film thickness range in this region, the variation in the absorptance of the a-Si film due to film thickness fluctuation is reduced.

Furthermore, with regard to the film thickness range of the a-Si film 904, the minimum film thickness of the a-Si film 904 is set at 20 nm which is in the vicinity of the lower limit at which film forming is possible, and the maximum film thickness of the a-Si film 904 is 80 nm which is the practical upper limit. Likewise, the film thickness range of the SiO₂ film 903 is set at a practical usage range, and is approximately 50 nm to 200 nm.

Figure 9C:
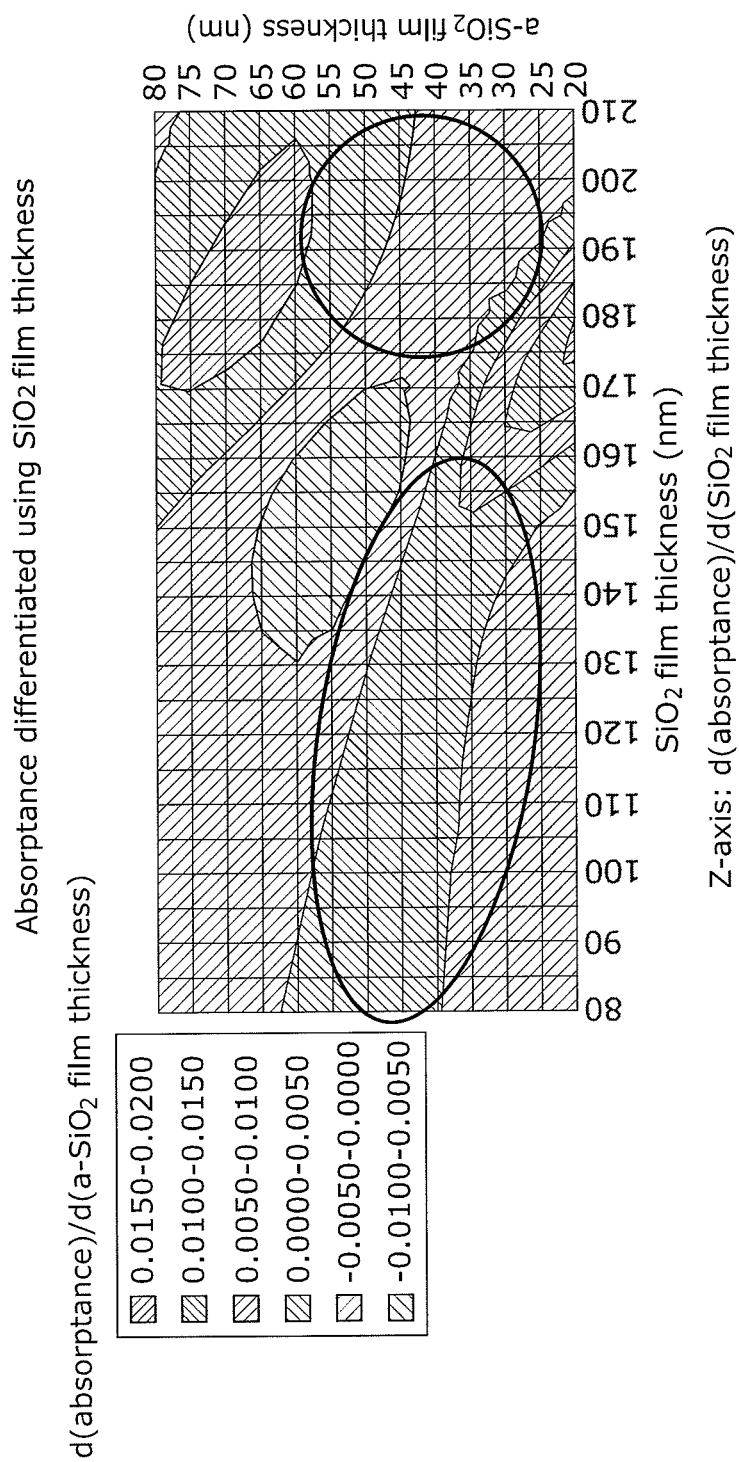
FIG. 9C is a graph showing calculation results in the case where the a-Si film thickness and the $SiO_2$ film thickness are changed.
Figure 9E:
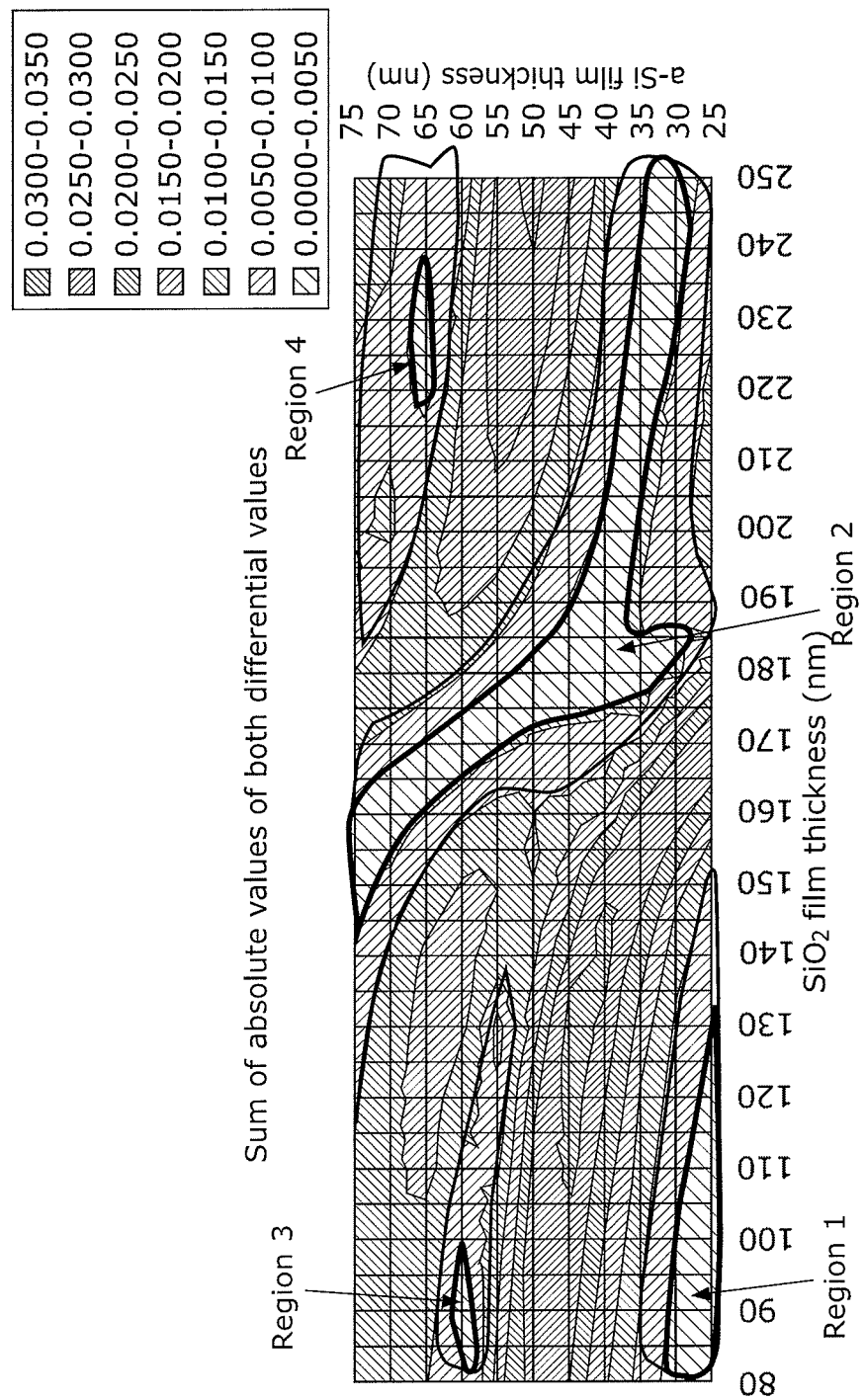
FIG. 9E is a graph showing calculation results in the case where the a-Si film thickness and the $SiO_2$ film thickness are changed.

Next, FIG. 9C shows a graph of results of differentiating the values in the graph in FIG. 9A or FIG. 9B with respect to the SiO₂ film thickness, and FIG. 9D shows a graph of results of differentiating the values in the graph in FIG. 9A or FIG. 9B with respect to the a-Si film. In addition, FIG. 9E shows a graph of results obtained by adding up the absolute values of the respective values in FIG. 9C and FIG. 9D.

As shown in FIG. 9C and FIG. 9D, the part (the regions surrounded by an ellipse in the figure) of a contour (Z-axis) region having a value which is close to 0 indicates that the absorptance of the a-Si film 904 has minimal film thickness dependency. Stated differently, this indicates that, even when there is unevenness in film thickness during the forming of the SiO₂ film 903 and the a-Si film 904, there is a minimal impact on (fluctuation in) the absorption of irradiated light (energy) to the a-Si film 904 when these films are formed within the corresponding film thickness range included in such region.

For example, when it is known that the a-Si film thickness distribution is small and the SiO₂ film thickness distribution is large when the SiO₂ film 903 and the a-Si film 904 are formed, a crystallization process by laser annealing that is not easily affected by SiO₂ film thickness fluctuation becomes possible by forming the SiO₂ film 903 and the a-Si film 904 within the corresponding film thickness range in the region of the part of the contour (Z-axis) region having a value which is close to 0 in FIG. 9C.

It should be noted that FIG. 9C shows the results obtained by differentiating the curve of the absorptance shown in FIG. 9A or FIG. 9B with respect to the SiO₂ film thickness, and shows the rate of change of the absorptance with respect to the change in SiO₂ film thickness. One of the regions surrounded by an ellipse in FIG. 9C is a region in which the film thickness of the a-Si film 904 is 25 nm to 60 nm and the film thickness of the SiO₂ film 903 is 80 nm to 160 nm, the other of the regions is a region in which the film thickness of the a-Si film 904 is 25 nm to 55 nm and the film thickness of the SiO₂ film 903 is 180 nm to 210 nm. Furthermore, the value of the respective regions of the contour (Z-axis) in FIG. 9C is represented as d(absorptance)/d(SiO₂ film thickness).

Furthermore, FIG. 9C shows the results obtained by differentiating the curve of the absorptance shown in FIG. 9A or FIG. 9B with respect to the a-Si film thickness, and shows the rate of change of the absorptance with respect to the change in a-Si film thickness. The region surrounded by an ellipse in FIG. 9D is a region in which the film thickness of the a-Si film 904 is 30 nm to 60 nm and the film thickness of the SiO₂ film 903 is 160 nm to 195 nm. Furthermore, the value of the respective regions of the contour (Z-axis) in FIG. 9D is represented as d(absorptance)/d(SiO₂ film thickness).

Furthermore, FIG. 9E is a graph showing the sum of the absolute values of the respective film thicknesses in FIG. 9C and FIG. 9D.

In FIG. 9E, each of the parts (region 1 to region 4) of the contour (z-axis) which has a value close to 0 indicates minimal film thickness dependency on the film thickness of the a-Si film 904 and the film thickness of the SiO₂ film 903.

Therefore, when each of the SiO₂ film 903 and the a-Si film 904 is formed within the corresponding film thickness range included in this region, even when a green laser is emitted, the irradiated light (energy) that is absorbed by the a-Si film 904 is not easily affected by unevenness in the film thickness of each of the a-Si film 904 and the SiO₂ film 903. In other words, stable crystallization by laser annealing can be performed.

It should be noted that region 1 to region 4 shown in FIG. 9E are the ranges defined by the subsequent expressions. d(a-Si) denotes the film thickness of the a-Si film 904, d(SiO₂) denotes the film thickness of the SiO₂ film 903.

Region 1 is the region that is changed into numerical form using Expression 8, Expression 9, and Expression 10.

$$d(a\text{-Si}) \geq 25 \text{ nm} \quad \text{(Expression 8)}$$

$$d(SiO_2) \geq 80 \text{ nm} \quad \text{(Expression 9)}$$

$$d(a\text{-Si}) \leq (-0.0015 \times (d(SiO_2))^2 + 0.1929 \times d(SiO_2) + 30.105) \text{ nm} \quad \text{(Expression 10)}$$

Region 2 is the region that is changed into numerical form using Expression 11, Expression 12, Expression 13, Expression 14, and Expression 15.
(a-Si Film Thickness Upper Limit)

$$d(a\text{-Si}) \leq 75 \text{ nm, where } d(SiO_2) \leq 170 \text{ nm} \quad \text{(Expression 11)}$$

$$d(a\text{-Si}) \leq (-0.0001 \times (d(SiO_2))^3 + 0.0969 \times (d(SiO_2))^2 - 22.395 \times (d(SiO_2)) + 1769.8) \text{ nm},$$
$$\text{where } d(SiO_2) \geq 170 \text{ nm} \quad \text{(Expression 12)}$$

(a-Si Film Thickness Lower Limit)

$$d(a\text{-Si}) \geq -0.007 \times (d(SiO_2))^3 + 0.2932 \times (d(SiO_2))^2 - 38.913 \times (d(SiO_2)) + 1797.2 \text{ nm},$$
$$\text{where } 120 \text{ nm} \leq d(SiO_2) \leq 163 \text{ nm} \quad \text{(Expression 13)}$$

$$d(a\text{-Si}) \geq -0.0438 \times (d(SiO_2))^2 - 16.494 \times (d(SiO_2)) + 1574.8 \text{ nm, where } 163 \text{ nm} \leq d(SiO_2) \leq 200 \text{ nm} \quad \text{(Expression 14)}$$

$$d(a\text{-Si}) \geq -0.12 \times (d(SiO_2)) + 52 \text{ nm},$$
$$\text{where } 200 \text{ nm} \leq d(SiO_2) \quad \text{(Expression 15)}$$

Region 3 is the region that is changed into numerical form using Expression 16, Expression 17, and Expression 18.

$$d(SiO_2) \geq 80 \text{ nm} \quad \text{(Expression 16)}$$

$$d(a\text{-Si}) \leq 0.002 \times (d(SiO_2))^2 + 0.2489 \times d(SiO_2) + 57.966 \text{ nm} \quad \text{(Expression 17)}$$

$$d(a\text{-Si}) \geq 0.0005 \times (d(SiO_2))^2 - 0.1681 \times d(SiO_2) + 67.03 \text{ nm} \quad \text{(Expression 18)}$$

Region 4 is the region that is changed into numerical form using Expression 19, Expression 20, and Expression 21.

$$d(a\text{-Si}) \leq 75 \text{ nm} \quad \text{(Expression 19)}$$

$$d(a\text{-Si}) \leq 0.0087 \times (d(SiO_2))^2 - 4.421 \times d(SiO_2) + 628.38 \text{ nm} \quad \text{(Expression 20)}$$

$$d(a\text{-Si}) \geq 0.0031 \times (d(SiO_2))^2 - 1.5578 \times d(SiO_2) + 255.6 \text{ nm} \quad \text{(Expression 21)}$$

It should be noted that the preferable region in region 1 to region 4 shown in FIG. 9E shall be changed into numerical form.

The preferable range in region 1 is the region that is changed into numerical form using Expression 22, Expression 23, and Expression 24.

$$d(a\text{-Si}) \geq 25 \text{ nm} \quad \text{(Expression 22)}$$

$$d(SiO_2) \geq 80 \text{ nm} \quad \text{(Expression 23)}$$

$$d(a\text{-Si}) \leq -0.15 \times d(SiO_2) + 44 \text{ nm} \quad \text{(Expression 24)}$$

The preferable range in region 2 is the region that is changed into numerical form using Expression 25, Expression 26, Expression 27, Expression 28, and Expression 29.
(a-Si Film Thickness Upper Limit)

$$d(a\text{-Si}) \leq 75 \text{ nm, where } d(SiO_2) \leq 160 \text{ nm} \quad \text{(Expression 25)}$$

$$d(a\text{-Si}) \leq -0.0001 \times (d(SiO_2))^3 + 0.0691 \times (d(SiO_2))^2 - 15.923 \times (d(SiO_2)) + 1264.9 \text{ nm},$$
$$\text{where } d(SiO_2) \geq 160 \text{ nm} \quad \text{(Expression 26)}$$

(a-Si Film Thickness Lower Limit)

$$d(a\text{-Si}) \geq -0.0333 \times (d(SiO_2))^2 + 9.5333 \times (d(SiO_2)) - 606.5 \text{ nm, where } 145 \text{ nm} \leq d(SiO_2) \leq 180 \text{ nm} \quad \text{(Expression 27)}$$

$$d(a\text{-Si}) \geq 0.1 \times (d(SiO_2))^2 - 36.5 \times (d(SiO_2)) + 3360 \text{ nm},$$
$$\text{where } 180 \text{ nm} \leq d(SiO_2) \leq 190 \text{ nm} \quad \text{(Expression 28)}$$

$$d(a\text{-Si}) \geq -0.1339 \times (d(SiO_2)) + 60.358 \text{ nm, where } 190 \text{ nm} \leq d(SiO_2) \quad \text{(Expression 29)}$$

The preferable range in region 3 is the range that is changed to numerical form using Expression 30, Expression 31, and Expression 32.

$$d(SiO_2) \geq 80 \text{ nm} \quad \text{(Expression 30)}$$

$$d(a\text{-Si}) \leq 0.02 \times (d(SiO_2))^2 + 3.5 \times d(SiO_2) - 90 \text{ nm} \quad \text{(Expression 31)}$$

$$d(a\text{-Si}) \geq 0.005 \times (d(SiO_2))^2 - 0.85 \times d(SiO_2) + 95 \text{ nm} \quad \text{(Expression 32)}$$

The preferable range in region 4 is the range that is changed to numerical form using Expression 33, and Expression 34.

$$d(a\text{-Si}) \leq -0.02 \times (d(SiO_2))^2 + 9.1 \times d(SiO_2) - 967 \text{ nm} \quad \text{(Expression 33)}$$

$$d(a\text{-Si}) \geq 0.0133 \times d(SiO_2) - 6.0667 \times d(SiO_2) + 753 \text{ nm} \quad \text{(Expression 34)}$$

As described above, it is preferable that the film thickness of the a-Si film 904 and the film thickness of the $SiO_2$ film 903 be set (formed) within the corresponding film thickness range belonging to any region from among the above-described region 1 to region 4.

More preferably, the film thickness of the $SiO_2$ film 903 in the film thickness range belonging to region 2 is formed to 160 nm to 190 nm, and the film thickness of the a-Si film 904 is formed to 30 nm to 45 nm. With this, even when using a green laser, the crystallization process can be performed while minimizing the effects of film thickness unevenness occurring when the a-Si film 904 and the $SiO_2$ film 903 are formed.

As described above, it is possible to find the film thickness range (allowable range) for the a-Si film and the insulating film, which is a base film of the a-Si film, in which the effects of film thickness fluctuation on the absorptance of the a-Si film is minimal. This can be found by differentiating the absorptance, and extracting the film thickness range in which absorptance variation is minimal.

(Effects of Changing the Metal Material)

It should be noted that although description thus far has been limited to the case where Mo is fixed as the metal material used in the metal film in the model structure in FIG. 7A, the material is not limited to Mo. This is described below.

Figures 10, 11A:
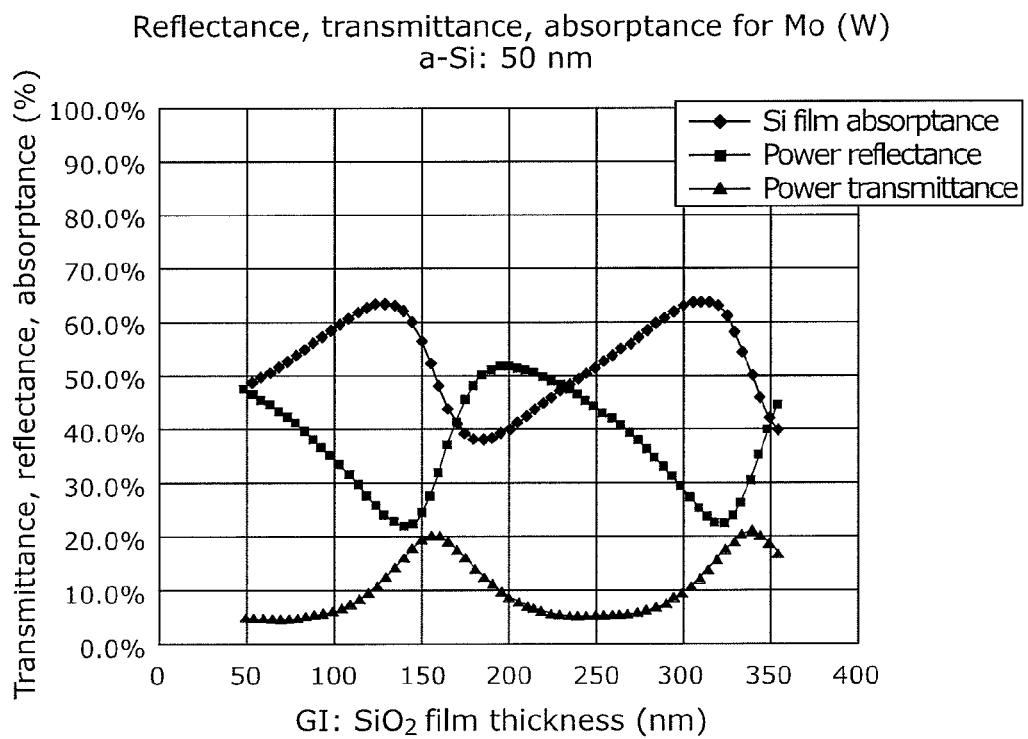
FIG. 10 is a table showing metal materials to be used in the metal film in the model structure in FIG. 7A and refraction indices thereof.
FIG. 11A is a graph showing calculation results when the $SiO_2$ film thickness is changed in the case where the film thickness of the a-Si film is 50 nm.

FIG. 10 is a table showing metal materials to be used in the metal film in the model structure in FIG. 7A and refraction indices thereof. Here, the refraction indices for a 532 nm waveform are indicated for Mo, Al, Cu, and W. In addition, the absorptance of the a-Si film is calculated using these refraction indices.

Figure 11B:
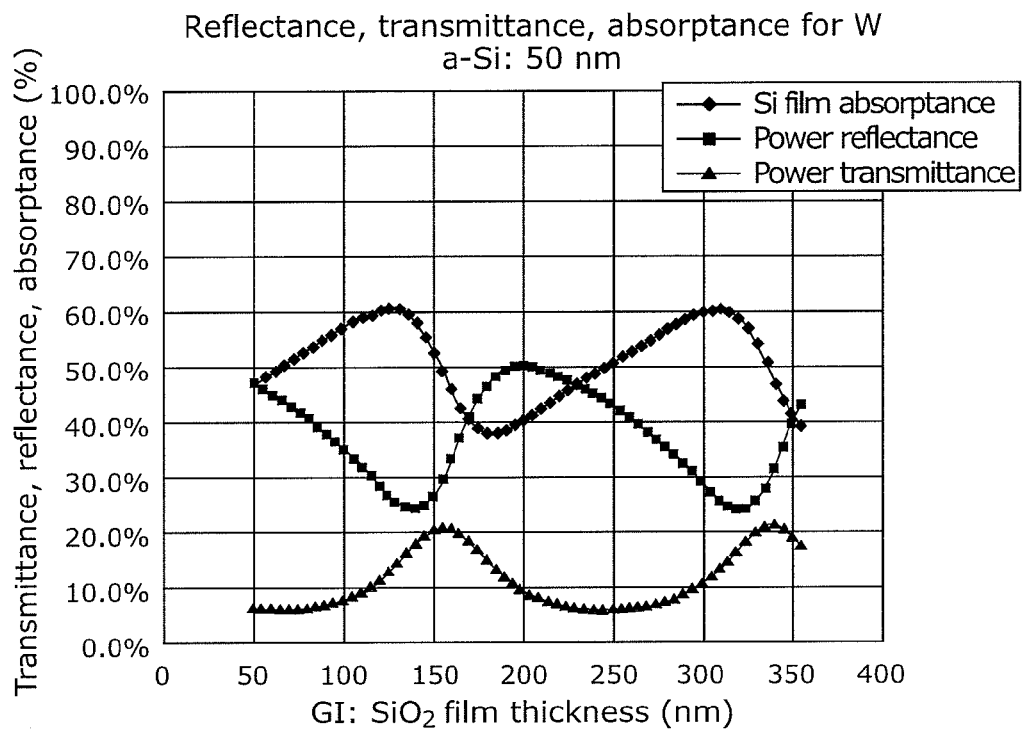
FIG. 11B is a graph showing calculation results when the $SiO_2$ film thickness is changed in the case where the film thickness of the a-Si film is 50 nm.
Figure 11C:
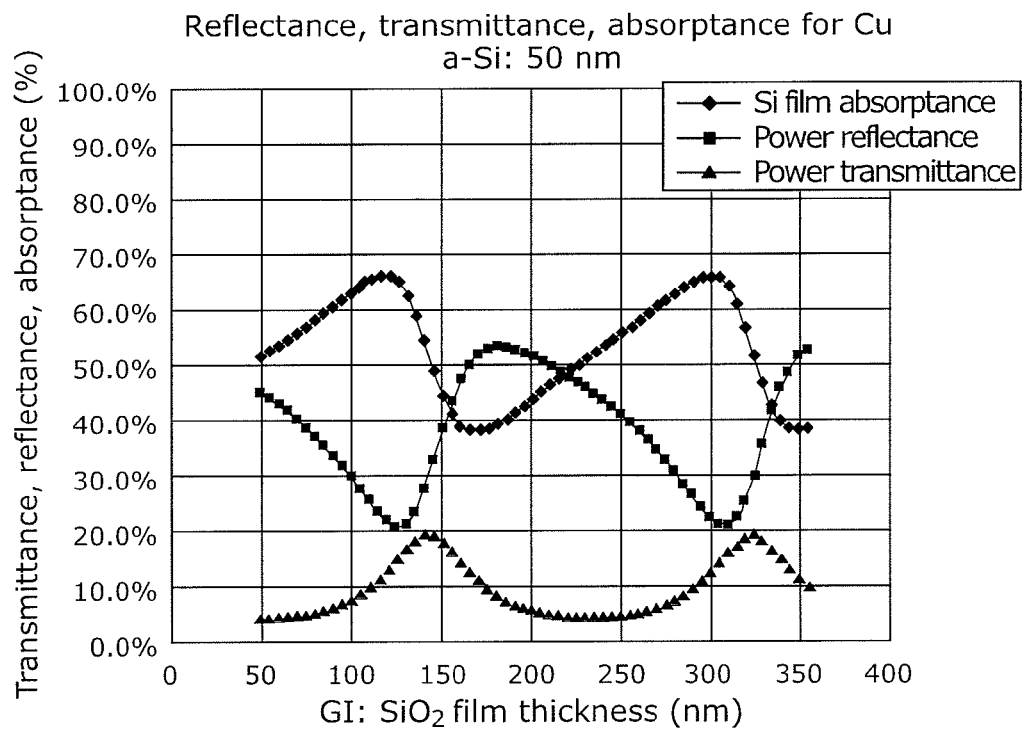
FIG. 11C is a graph showing calculation results when the $SiO_2$ film thickness is changed in the case where the film thickness of the a-Si film is 50 nm.
Figure 11D:
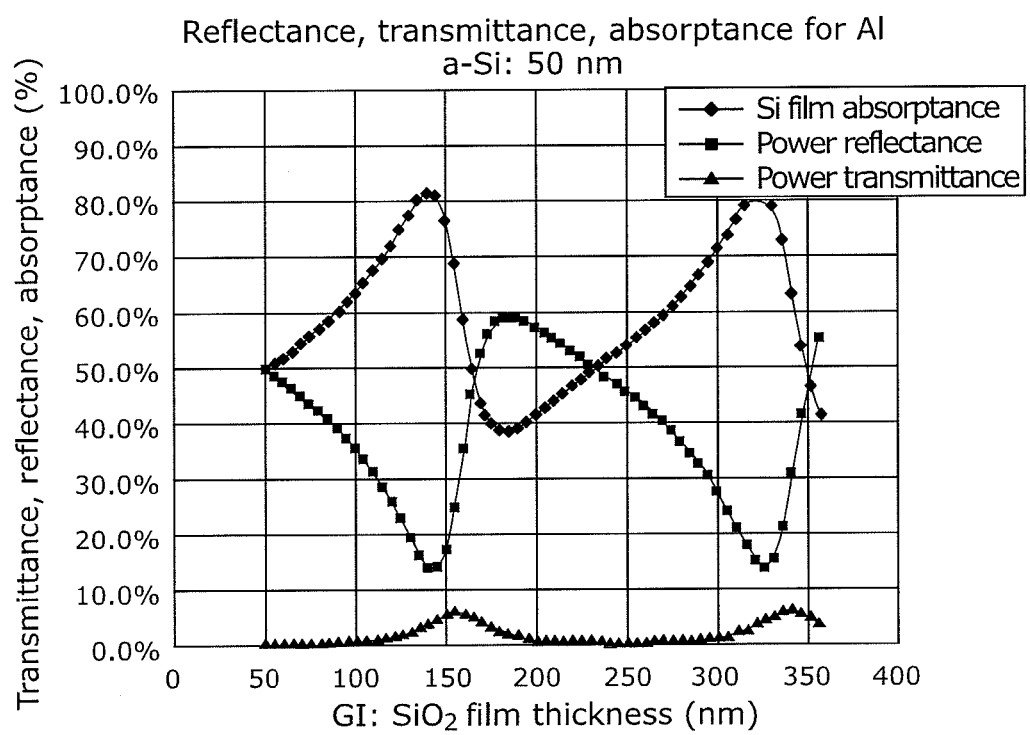
FIG. 11D is a graph showing calculation results when the $SiO_2$ film thickness is changed in the case where the film thickness of the a-Si film is 50 nm.

FIG. 11A to FIG. 11D are graphs showing the calculation results when the $SiO_2$ film thickness is changed in the case where the film thickness of the a-Si film is 50 nm. Specifically, FIG. 11A shows the $SiO_2$ film thickness dependency of the absorptance of the a-Si film in the case where Mo is used as the metal material used for the metal film 902. In the same manner, FIG. 11B shows the case where W is used as the metal material used for the metal film 902, and FIG. 11C shows the case where Cu is used as the metal material used for the metal film 902. FIG. 11D shows the case where Al is used as the metal material used for the metal film 902.

As shown in FIG. 11A to FIG. 11D, it can be seen that the absolute value and wavelength dependence of the absorptance of the a-Si film shift due to the differences in refraction indices among the metal materials used for the metal film 902. In this manner, although the waveform of the absorptance of the a-Si film does not change significantly depending on the metal material used for the metal film 902, its waveform shifts to the wavelength direction.

Figure 12A:
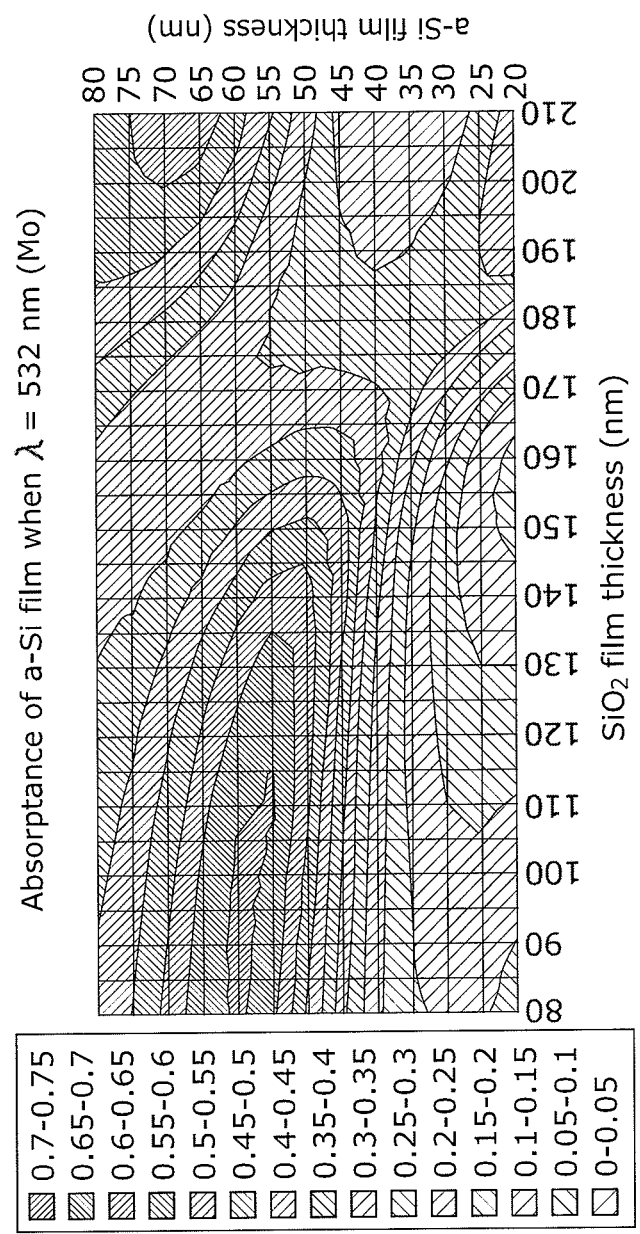
FIG. 12A is a graph showing calculation results when the a-Si film thickness and the $SiO_2$ film thickness are changed in the case where the metal material is Mo.
Figure 12B:
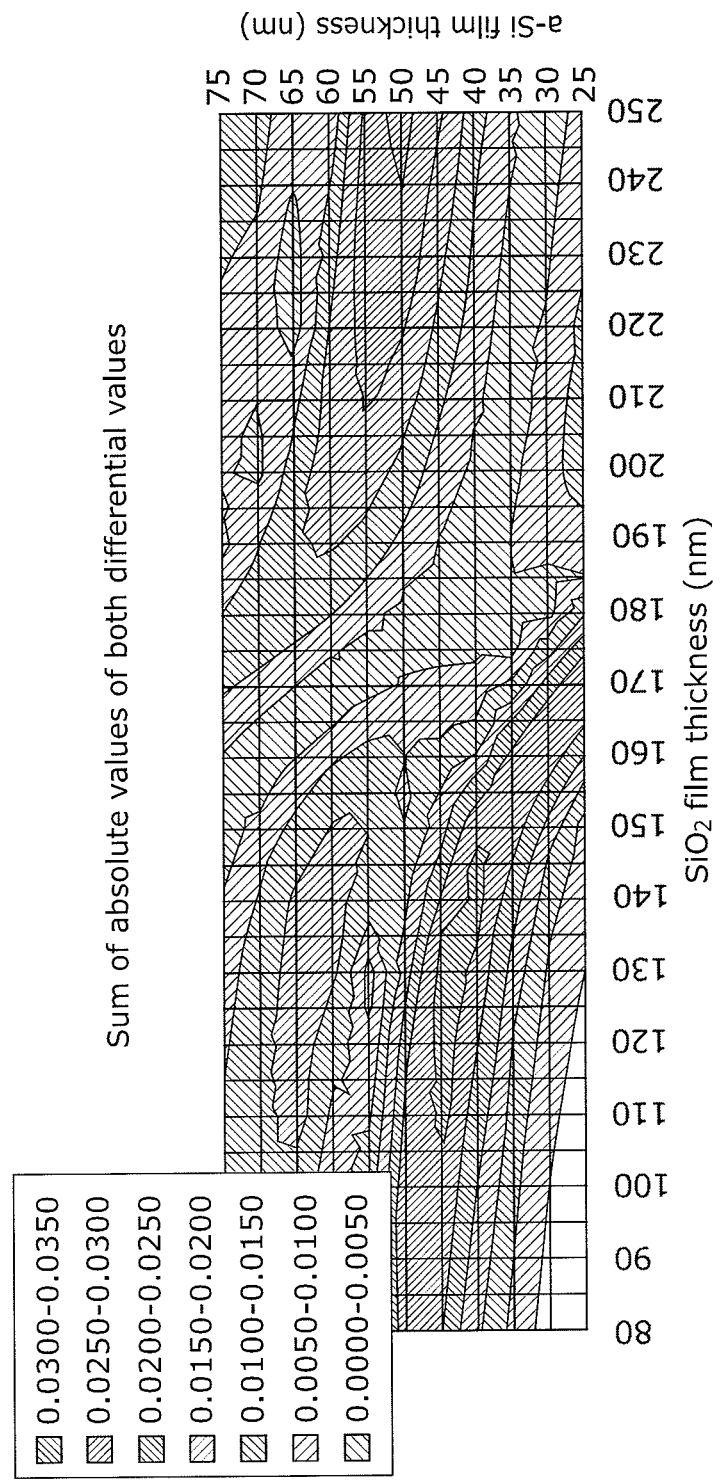
FIG. 12B is a graph showing calculation results when the a-Si film thickness and the $SiO_2$ film thickness are changed in the case where the metal material is Mo.

FIG. 12A and FIG. 12B are graphs showing calculation results when the a-Si film thickness and the $SiO_2$ film thickness are changed in the case where the metal material is Mo.

Figure 13A:
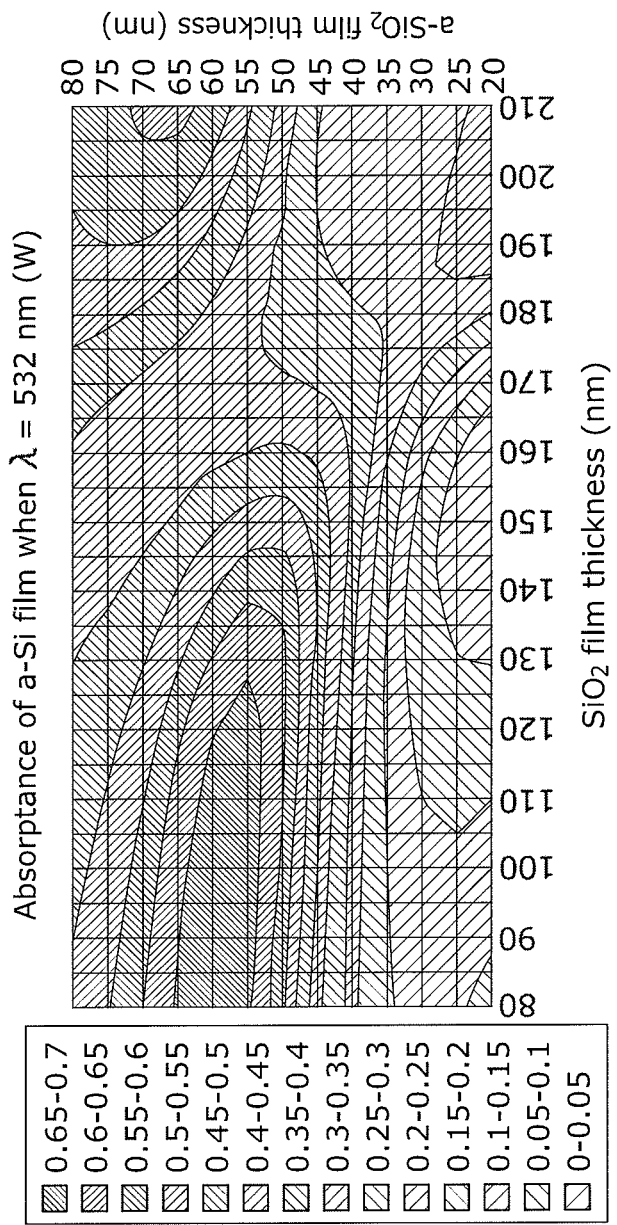
FIG. 13A is a graph showing calculation results when the a-Si film thickness and the $SiO_2$ film thickness are changed in the case where the metal material is W.
Figure 13B:
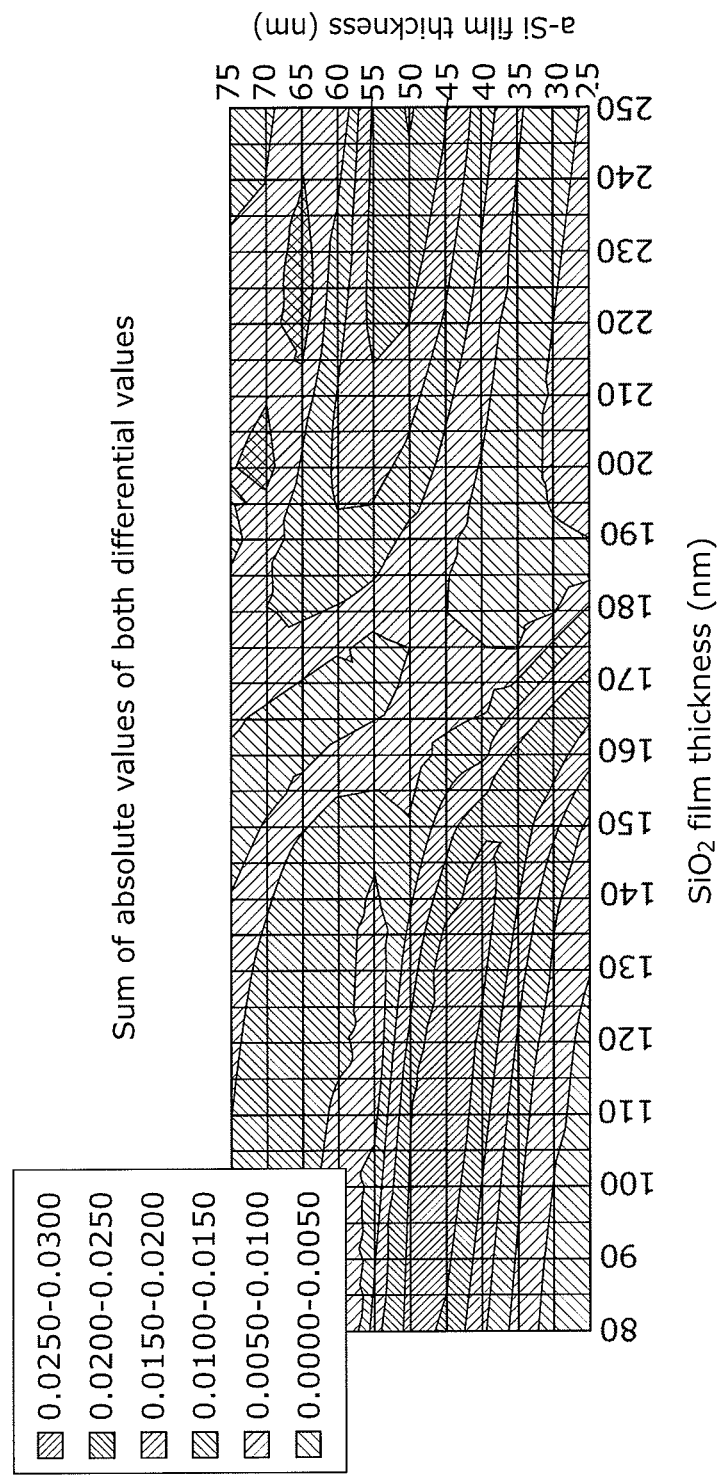
FIG. 13B is a graph showing calculation results when the a-Si film thickness and the $SiO_2$ film thickness are changed in the case where the metal material is W.
Figure 14A:
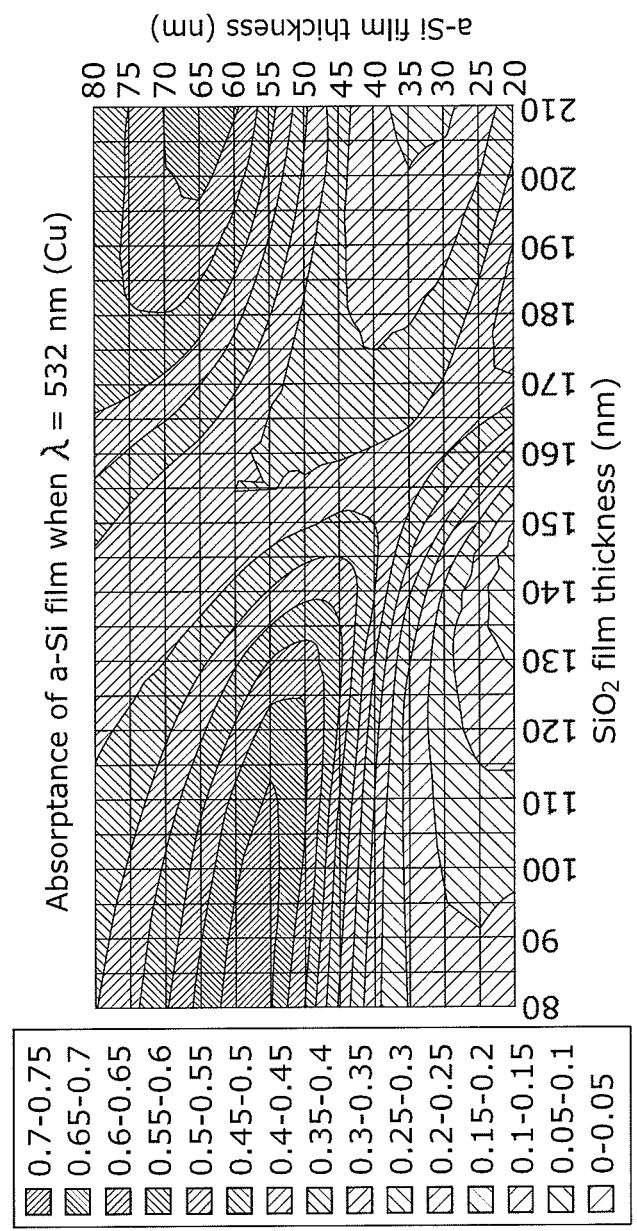
FIG. 14A is a graph showing calculation results when the a-Si film thickness and the $SiO_2$ film thickness are changed in the case where the metal material is Cu.
Figure 14B:
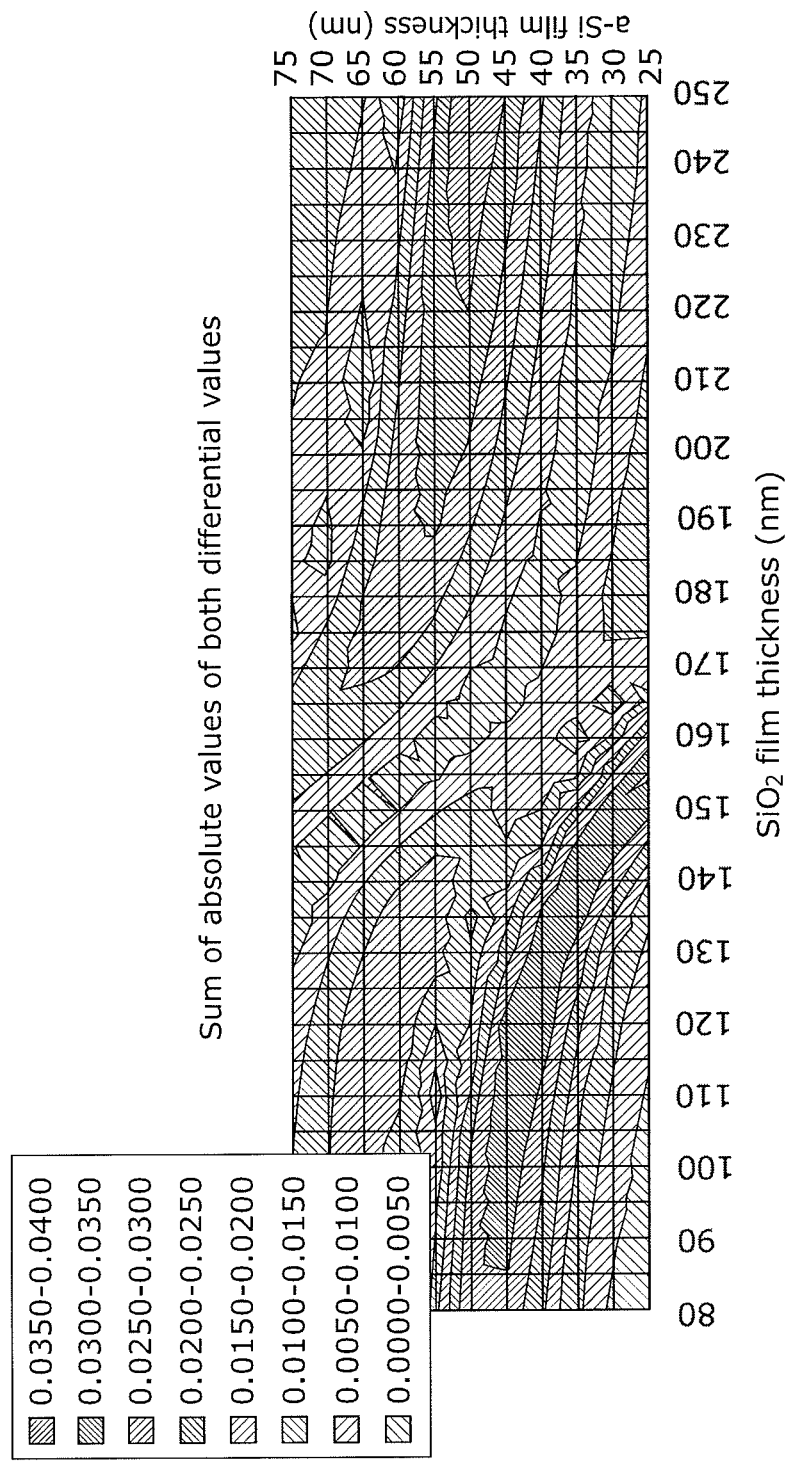
FIG. 14B is a graph showing calculation results when the a-Si film thickness and the $SiO_2$ film thickness are changed in the case where the metal material is Cu.
Figure 15A:
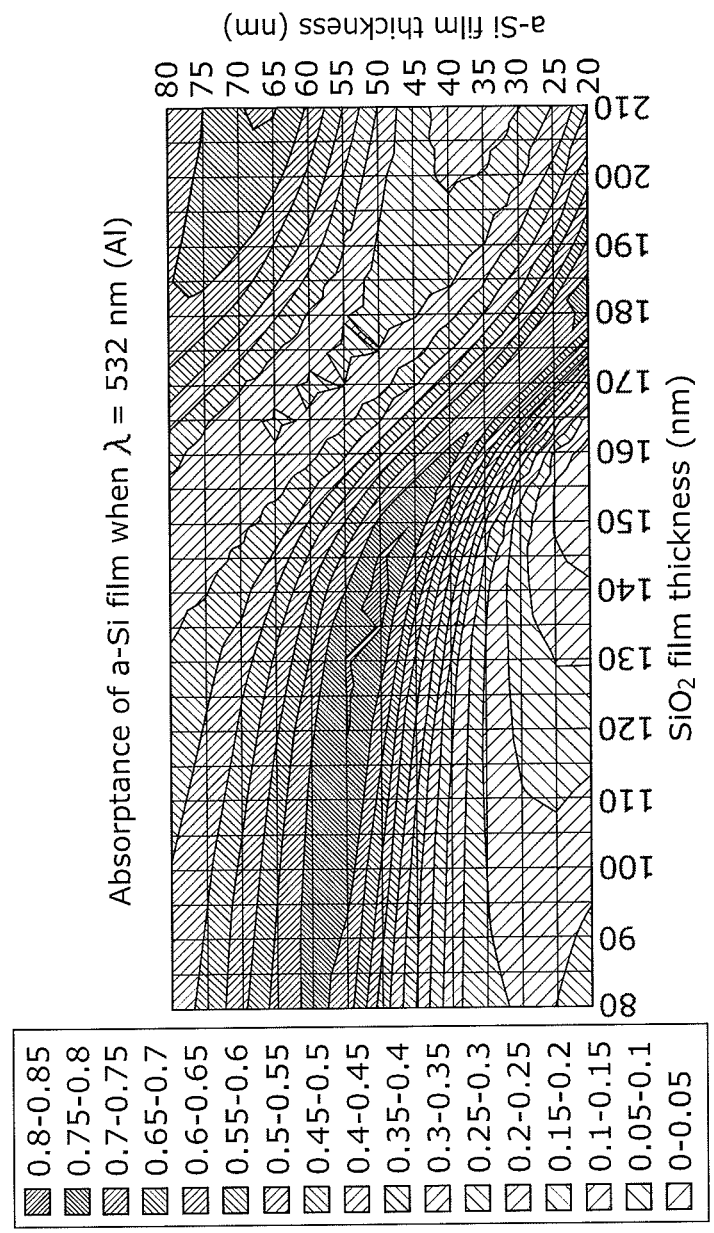
FIG. 15A is a graph showing calculation results when the a-Si film thickness and the $SiO_2$ film thickness are changed in the case where the metal material is Al.
Figure 15B:
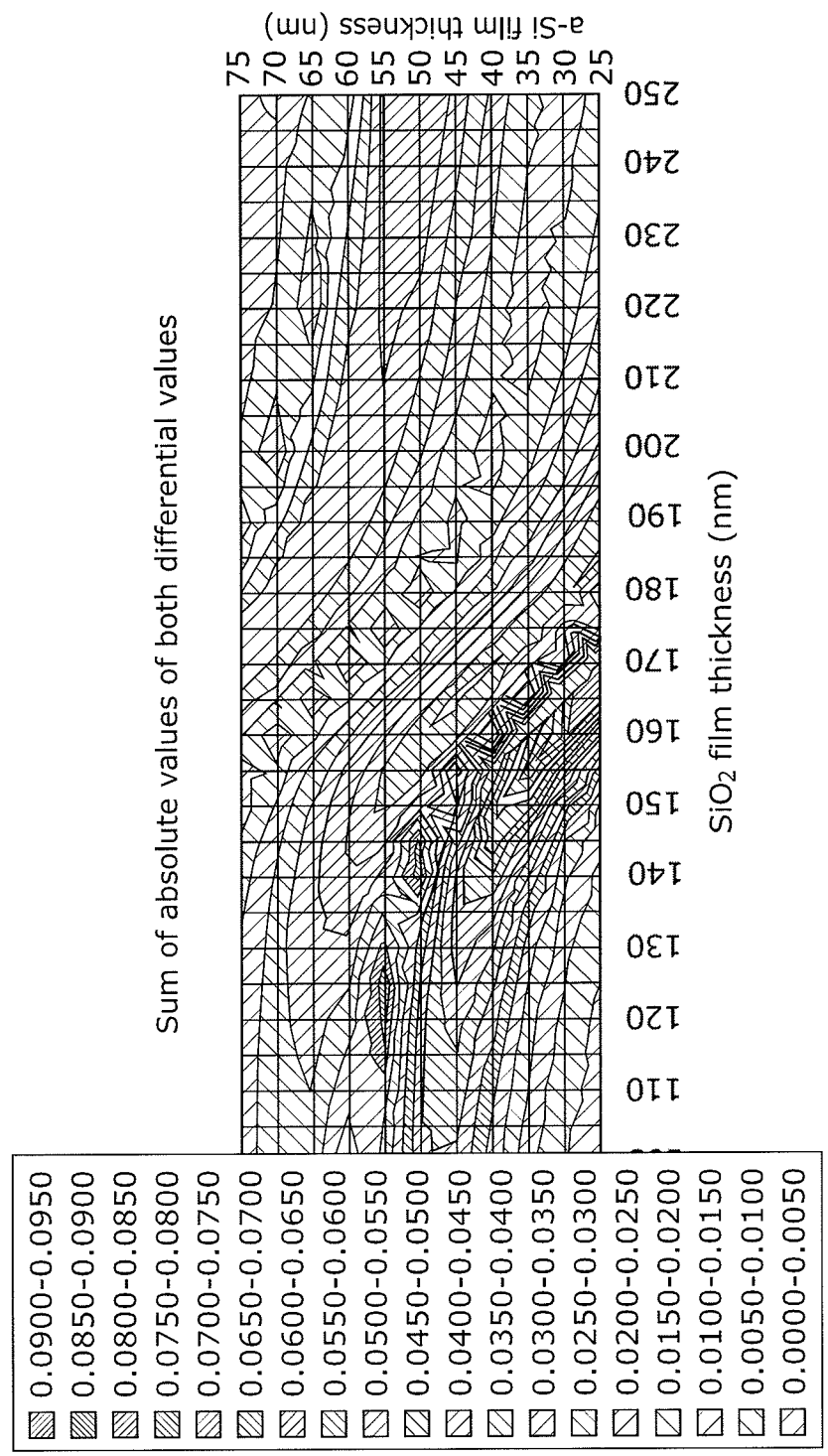
FIG. 15B is a graph showing calculation results when the a-Si film thickness and the $SiO_2$ film thickness are changed in the case where the metal material is Al.

Specifically, 12A is a contour of the calculation results when the a-Si film thickness and the SiO$_2$ film thickness are changed in the case where the metal material used for the metal film 902 is Mo. FIG. 12B is a graph showing the sum of absolute values of respective results of differentiating the absorptance curve shown in FIG. 12A with respect to the a-Si film thickness and the SiO$_2$ film thickness. In the same manner, FIG. 13A and FIG. 13B show the case where W is used as the metal material used for the metal film 902, and FIG. 14A and FIG. 14B show the case where Cu is used as the metal material used for the metal film 902. FIG. 15A and FIG. 15B show the case where Al is used as the metal material used for the metal film 902.

Comparing FIG. 12A and FIG. 12B with FIG. 13A and FIG. 13B, it can be seen that the maximum value of the absorptance of the a-Si film 904 in the case where W is used as the metal material used for the metal film 902 is slightly lower compared to when Mo is used as the metal material used for the metal film 902. Furthermore, it can be seen that there is no difference in the dependency of the absorptance of the a-Si film 904 on the film thickness of the SiO2 film 903 and a-Si film 904.

In the same manner, comparing FIG. 12A and FIG. 12B with FIG. 14A and FIG. 14B, it can be seen that the maximum value of the absorptance of the a-Si film 904 in the case where Cu is used as the metal material used for the metal film 902 is slightly lower compared to when Mo is used as the metal material used for the metal film 902. Furthermore, it can be seen that there is no difference in the dependency of the absorptance of the a-Si film 904 on the film thickness of the SiO2 film 903 and a-Si film 904. However, the waveform (contour) of the absorptance of the a-Si film has shifted approximately 10 nm to the direction in which the SiO$_2$ film 903 is thinner.

Furthermore, comparing FIG. 12A and FIG. 12B with FIG. 15A and FIG. 15B in the same manner, it can be seen that the dependency of the absorptance of the a-Si film 904 on the film thickness of the SiO2 film 903 and a-Si film 904 increases in the case where Al is used as the metal material used for the metal film 902. This is considered to be due to the fact that, since the reflectance of the metal film 902 made of Al per se is high, the amplitude of the absorptance of the a-Si film 904 becomes large. It should be noted that, the waveform (contour) of the absorptance of the a-Si film has shifted approximately 10 nm to the direction in which the SiO$_2$ film 903 is thicker.

As described above, calculation was carried out for four types of metal materials having different refraction indices, namely, Mo, W, Cu, and Al, as the metal material used for the metal film 902. As a result, it is seen that the absolute values of the reflectance fluctuate depending on the difference in the refraction indices of the metal materials. When the waveforms of the dependency on the film thickness of the SiO$_2$ film 903 are compared, it can be seen that, although waveforms shifted approximately ±10 nm, as a larger trend there was no change. In other words, it can be seen that, aside from Mo which is a refractory metal, other metals may also be used as the metal material used for the metal film 902.

(Effects of Changing the Laser Wavelength)

Next, the effects in the case where the metal material used for the metal film in the model structure in FIG. 7A is fixed to Mo and the laser wavelength is changed shall be described.

Figures 16, 17A:
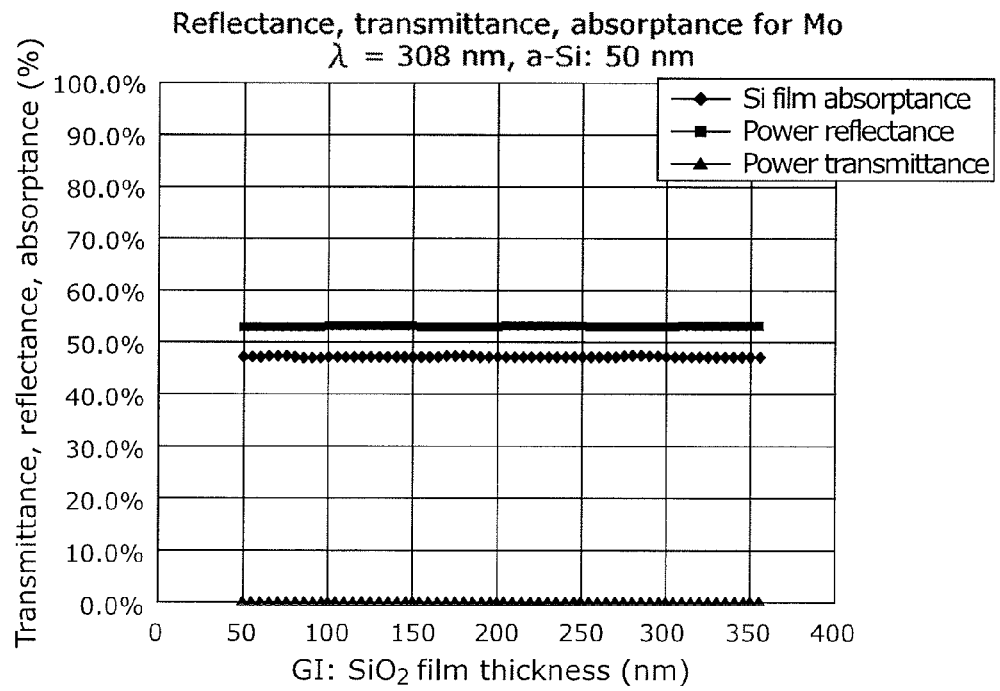
FIG. 16 is a table showing refraction indices of Mo and a-Si for respective laser wavelengths.
FIG. 17A is a graph showing calculation results when the $SiO_2$ film thickness is changed in the case where the film thickness of the a-Si film is 50 nm.

FIG. 16 is a table showing the refraction indices of Mo and a-Si for respective laser wavelengths. Here, the laser wavelengths to be used are 308 nm (excimer laser), 406 nm and 532 nm in the visible light region, and 808 nm in the infrared region. The absorptance of the a-Si is calculated below using these values. However, the SiN refraction index of 1.9 and SiO$_2$ refraction index of 1.46 are used without being changed.

Figure 17B:
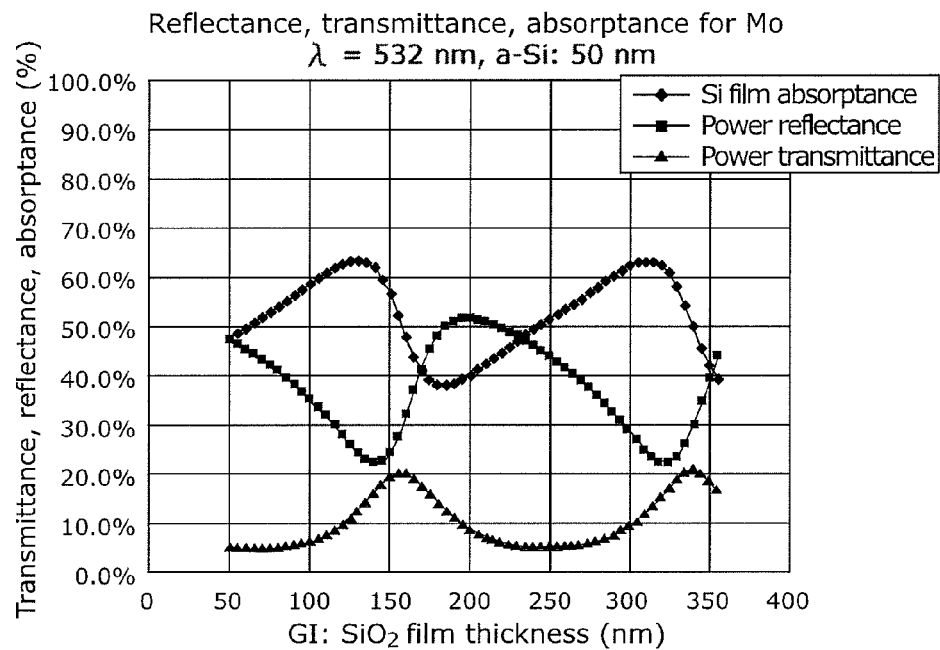
FIG. 17B is a graph showing calculation results when the $SiO_2$ film thickness is changed in the case where the film thickness of the a-Si film is 50 nm.
Figure 17C:
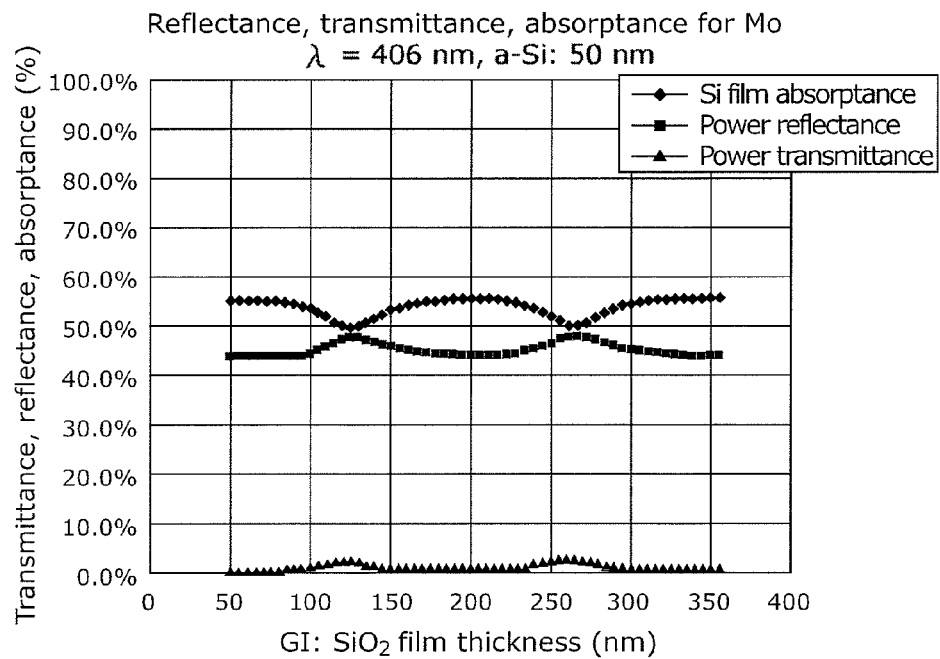
FIG. 17C is a graph showing calculation results when the $SiO_2$ film thickness is changed in the case where the film thickness of the a-Si film is 50 nm.
Figure 17D:
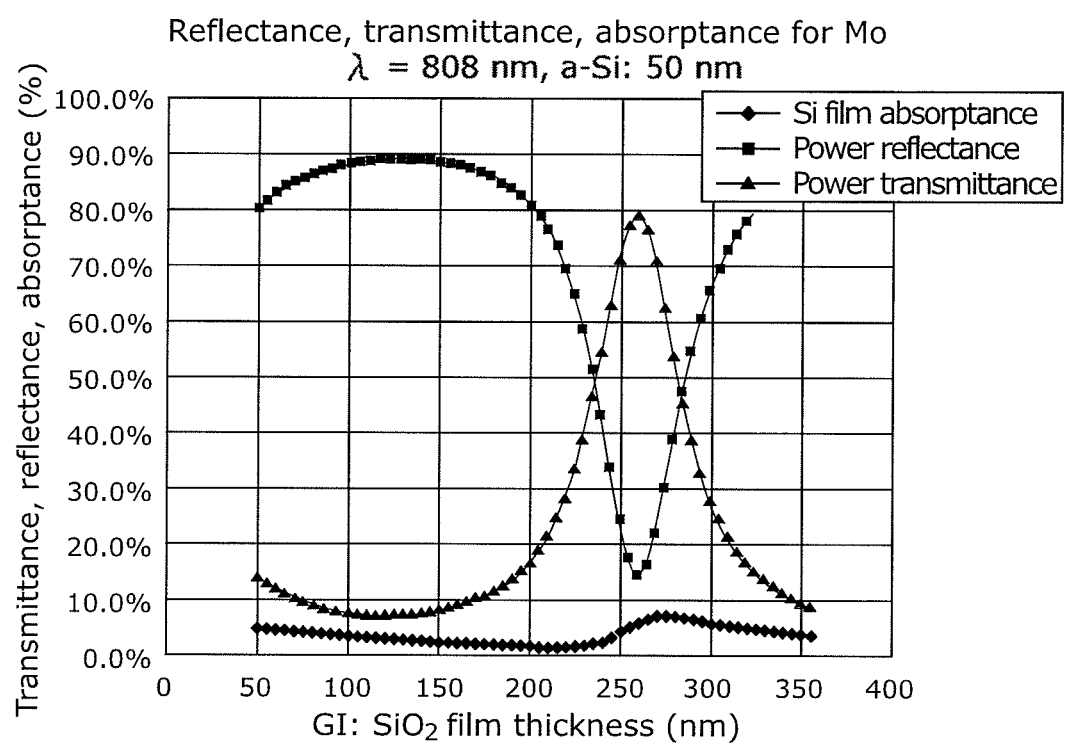
FIG. 17D is a graph showing calculation results when the $SiO_2$ film thickness is changed in the case where the film thickness of the a-Si film is 50 nm.

FIG. 17A to FIG. 17D are graphs showing the calculation results when the SiO$_2$ film thickness is changed in the case where the film thickness of the a-Si film is 50 nm. Specifically, FIG. 17A shows the SiO$_2$ film thickness dependency of the absorptance of the a-Si film in the case where the 308 nm laser wavelength is used. In the same manner, FIG. 17B shows the case where the 406 nm laser wavelength is used, and FIG. 17C shows the case where the 532 nm laser wavelength is used. FIG. 17D shows the case where the 808 nm laser wavelength is used.

Figure 18A:
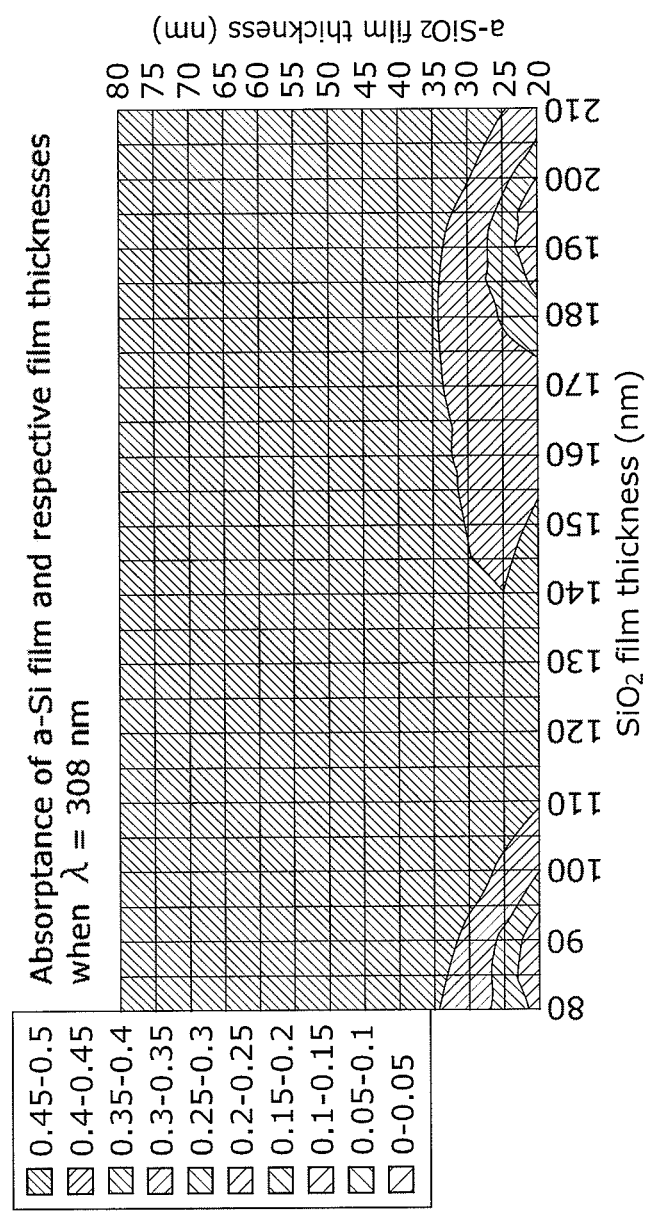
FIG. 18A is a graph showing calculation results in the case where the a-Si film thickness and the $SiO_2$ film thickness are changed for the respective laser wavelengths.
Figure 18B:
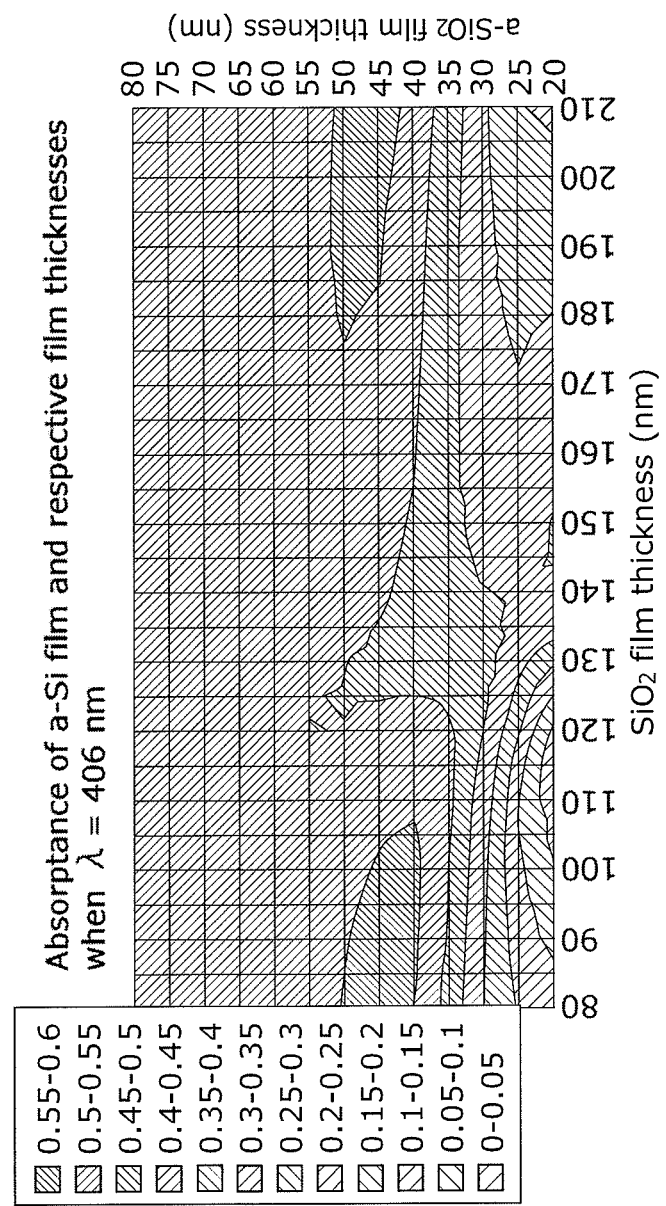
FIG. 18B is a graph showing calculation results in the case where the a-Si film thickness and the $SiO_2$ film thickness are changed for the respective laser wavelengths.
Figure 18C:
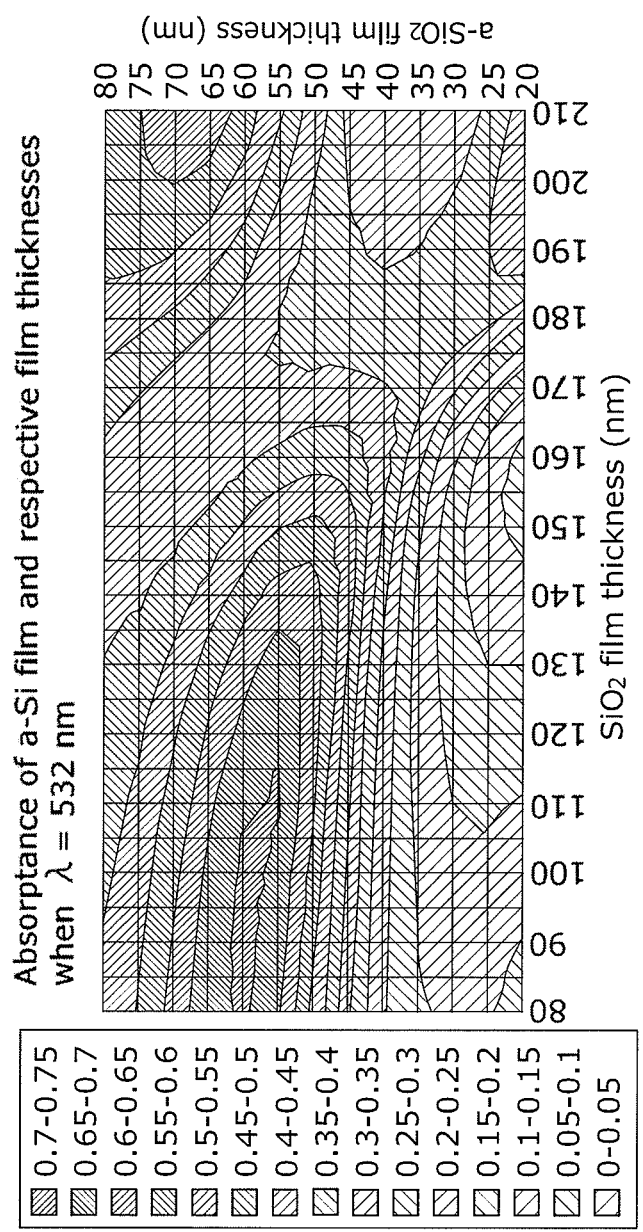
FIG. 18C is a graph showing calculation results in the case where the a-Si film thickness and the $SiO_2$ film thickness are changed for each of the laser wavelengths.
Figure 18D:
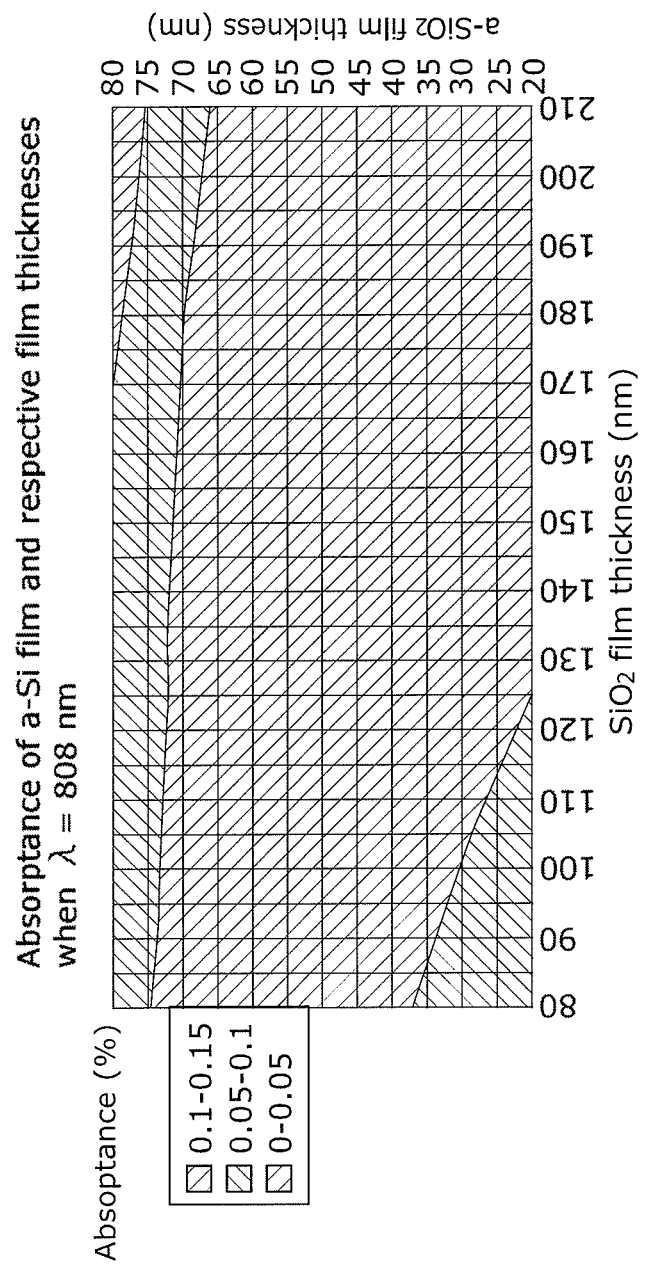
FIG. 18D is a graph showing calculation results in the case where the a-Si film thickness and the $SiO_2$ film thickness are changed for the respective laser wavelengths.

FIG. 18A to FIG. 18D are graphs showing calculation results in the case where the a-Si film thickness and the SiO$_2$ film thickness are changed for each of the laser wavelengths. Specifically, FIG. 18A is a graph showing the contour for the calculation results when the a-Si film thickness and the SiO$_2$ film thickness are changed in the case where the 308 nm laser wavelength is used. In the same manner, FIG. 18B shows the case where the 406 nm laser wavelength is used, and FIG. 18C shows the case where the 532 nm laser wavelength is used. FIG. 18D shows the case where the 808 nm laser wavelength is used.

From FIG. 17A to FIG. 17D and FIG. 18A to FIG. 18D, it can be seen that the absorption coefficient of the Si film changes significantly when the laser wavelength is changed. With the 308 nm laser wavelength, most of the light is absorbed when initially passing the a-Si film and almost none of the light passes through, and thus effects of interference is hardly seen. A similar situation is seen at 406 nm. In contrast, at 808 nm, light is not absorbed by the a-Si film, and thus most of the light is reflected or absorbed by the metal film. It should be noted that since the case of the 532 nm wavelength is previously described, description shall not be repeated.

Therefore, with regard to laser wavelengths, it can be seen that, when the excimer laser is excluded, a visible light range of near 400 nm, at which the effects of interference start becoming visible, to near 700 nm is acceptable. In other words, it can be seen that, aside from the 532 nm green laser, lasers having a wavelength in the visible light region can be used in the crystallization process.

(Second Embodiment)

In the first embodiment, the case where the gate insulating film is formed from SiO$_2$ is exemplified. In the second embodiment, the case where the gate insulating film is formed from a SiO$_2$/SiN layer stack in which a SiO$_2$ film is stacked on a SiN film. It should be noted that including a SiN film in the gate insulating film allows for the blocking of impurities such as alkaline metals from, for example, the glass which is the insulating substrate, and is thus effective as a means which does not affect TFT characteristics, reliability, and so on.

Figure 19:
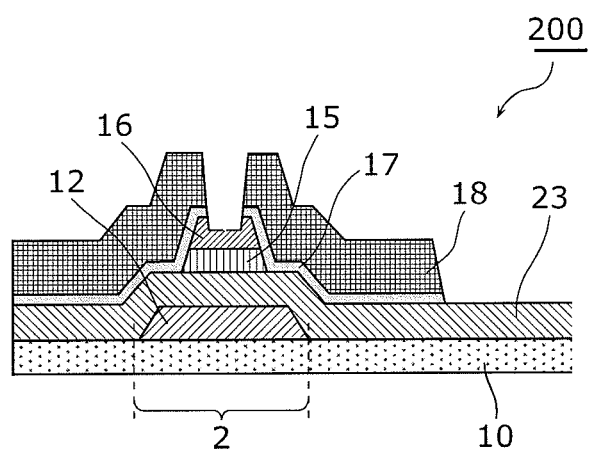
FIG. 19 is a cross-sectional view of a structure of a thin-film transistor included in an organic light-emitting display device according to a second embodiment of the present invention.

FIG. 19 is a cross-sectional view of a structure of a thin-film transistor included in an organic light-emitting display device according to the second embodiment of the present invention. The same numerical reference is given to elements that are the same as those in FIG. 1 and detailed description thereof shall not be repeated. A thin-film transistor 200 shown in FIG. 19 is different from the thin-film transistor 100 according to the first embodiment in terms of the configuration of a gate insulating film 23.

The gate insulating film 23 is formed so as to cover the gate electrode 12, and is made by stacking a silicon oxide (SiO$_2$) and a silicon nitride (SiN). Furthermore, the film thickness of the gate insulating film 23 is preferably formed so that the total of the optical path lengths of the SiO$_2$ film and the SiN film is between 250 nm and 280 nm, inclusive. For example, when 90 nm of the SiO$_2$ film and 70 nm of the SiN film are stacked as the film thickness of the gate insulating film 23, the total optical path length is 264 nm. Furthermore, for example, when 125 nm of the $SiO_2$ film and 50 nm of the SiN film are stacked as the film thickness of the gate insulating film 23, the total optical path length is 277 nm. Furthermore, for example, when 150 nm of the $SiO_2$ film and 30 nm of the SiN film are stacked, the total optical path length is 276 nm. Furthermore, for example, when 80 nm of the $SiO_2$ film and 80 nm of the SiN film are stacked, the total optical path length is 269 nm.

The thin-film transistor 200 is configured as described above.

It should be noted that the organic light-emitting display device including the thin-film transistor 200 is the same as that including the thin-film transistor 100 in the first embodiment, and thus description shall not be repeated.

Furthermore, the method of manufacturing the thin-film transistor 200, including the gate insulating film 23, is also the same, and thus description shall not be repeated.

As described above, the thin-film transistor 200 in the second embodiment is formed as a poly-Si TFT having the bottom-gate structure. At the time of manufacturing of the thin-film transistor 200, the gate insulating film 23 made of a $SiO_2$/SiN layer stack is formed on the gate electrode 12 so as to have a total optical path length of 250 nm to 280 nm. In addition, the amorphous silicon film 14, which is made from a-Si, is formed on the gate insulating film 23 so as to have a film thickness of 30 nm to 45 nm. Then, by performing laser annealing (crystallization) on the amorphous silicon film 14 using, for example, a green laser, the amorphous silicon film 14 is made into the crystal silicon film 15 which is made of poly-Si.

In this manner, the gate insulating film 23 and the amorphous silicon film 14 are formed within the corresponding film thickness range described above, at the time of manufacturing of the thin-film transistor 200 of the organic light-emitting display device according to the second embodiment. With this, when laser annealing (crystallization) is performed using, for example, a green laser, variation in the absorptance of the a-Si film caused by film-thickness fluctuation can be reduced. Specifically, the effects of the unevenness of the film thickness of the amorphous silicon film 14 and so on arising during the forming using CVD are not felt and stable crystallization becomes possible. In addition, it is possible to suppress the unevenness of characteristics of TFTs using the amorphous silicon film 14 and so, and improve the display quality of display devices such as LCDs or OLEDs.

It should be noted that the gate insulating film may be formed using a SiN/$SiO_2$ layer stack in which the SiN film is stacked on the $SiO_2$ film.

Furthermore, in the thin-film transistor 200, the existence of the above-described certain allowable range in the film thickness of the amorphous silicon film 14, which is made of a-Si, and the gate insulating film 23 was found by calculating the absorptance of the a-Si film during irradiation with a green laser (532 nm). This shall be described in detail below as an Example. It should be noted that description of parts which are the same as in the Example in the first embodiment shall not be repeated.

EXAMPLE

Here, calculations are carried out by replacing the $SiO_2$ film 903 (variable film thickness) with a $SiO_2$/SiN stacked film 1003 in which a SiN film and a $SiO_2$ film are provided. Here, the refraction index with respect to the 532 nm wavelength is assumed to be SiN=1.9. First, calculation is carried out with the SiN film thickness being fixed, and a region in which the absorptance of the a-Si film has minimal dependency on the film thickness of the a-Si film and $SiO_2$ film is extracted. Subsequently, the film thickness configuration at the extracted region is extracted, and the SiN dependency of the absorptance of the a-Si film is evaluated.

Figure 20A:
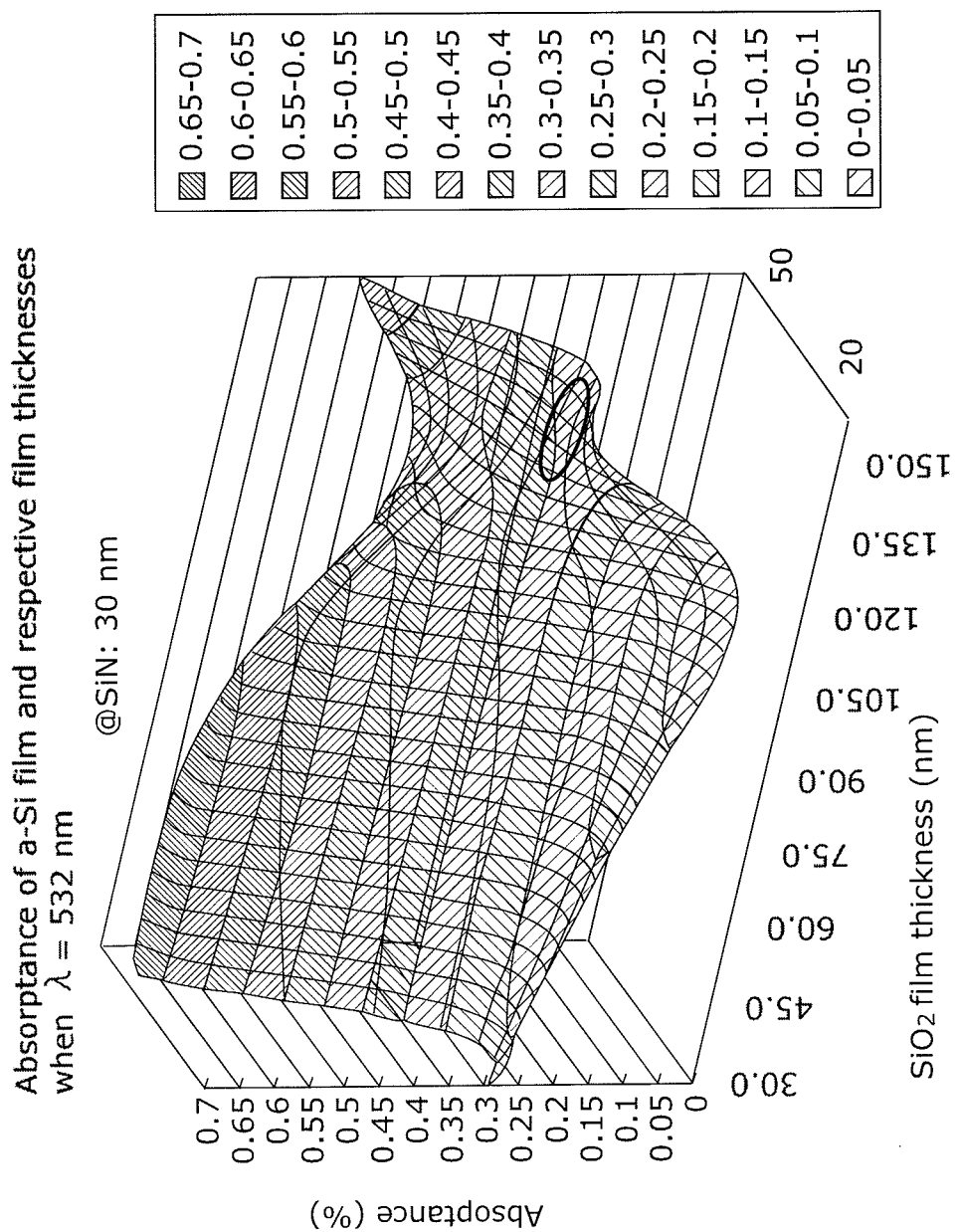
FIG. 20A is a graph showing calculation results when the a-Si film thickness and the $SiO_2$ film thickness are changed in the case where the film thickness of the SiN film is fixed at 30 nm.
Figure 20B:
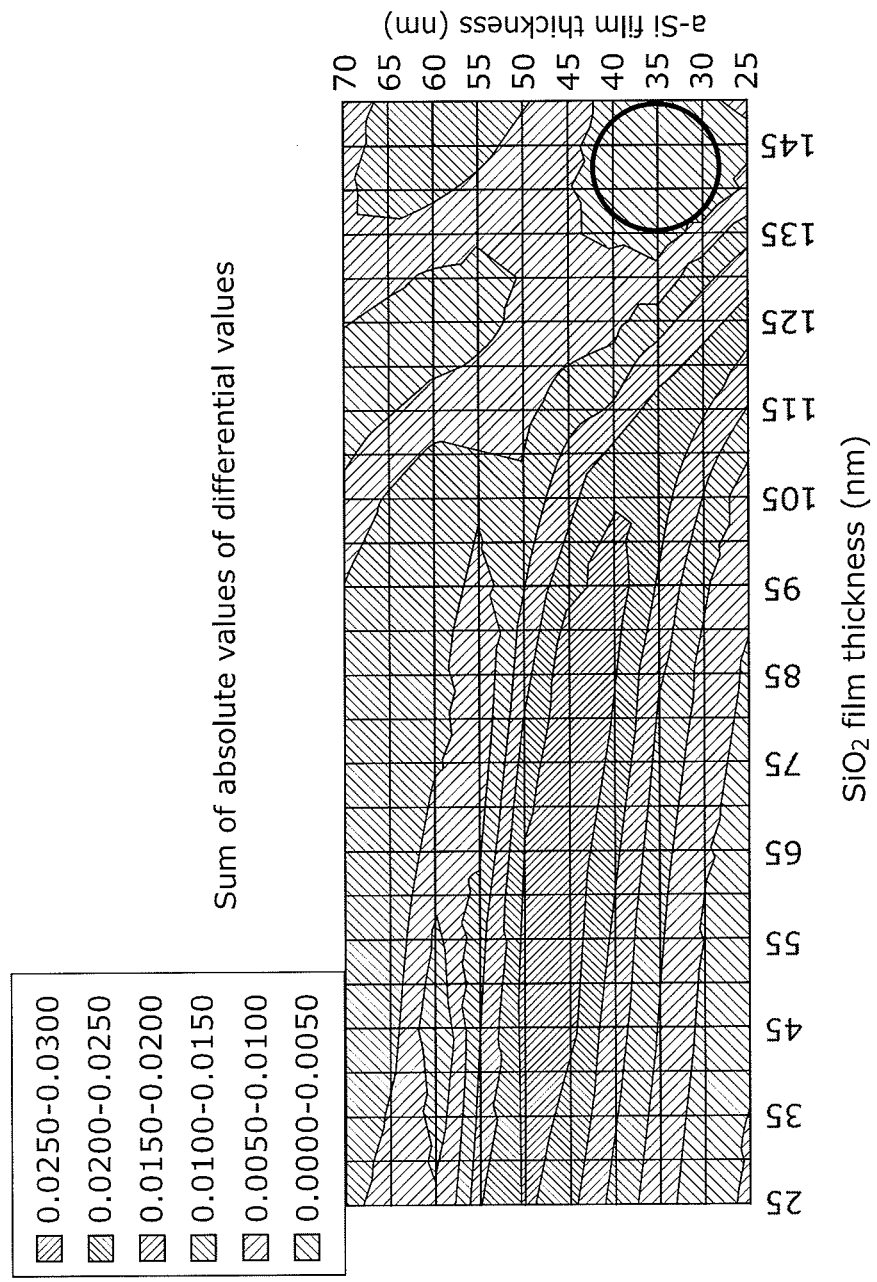
FIG. 20B is a graph showing calculation results when the a-Si film thickness and the SiO2 film thickness are changed in the case where the film thickness of the SiN film is fixed at 30 nm.

FIG. 20A to FIG. 20C are diagrams showing calculation results when the a-Si film thickness and the $SiO_2$ film thickness are changed in the case where the film thickness of the SiN film is fixed at 30 nm. Specifically, FIG. 20A is a graph showing the calculated absorptance when the a-Si film thickness and the $SiO_2$ film thickness are changed in the case where the film thickness of the SiN film is fixed at 30 nm. FIG. 20B shows the result of adding up the absolute values of results obtained from differentiating the curve of the absorptance shown in FIG. 20A with respect to the a-Si film thickness and the $SiO_2$ film thickness. Furthermore, FIG. 20C illustrates a film thickness configuration in the region having the preferred film thickness ranges.

From FIG. 20A and FIG. 20B, it can be seen that the region surrounded by the ellipse, that is, the region in which the $SiO_2$ film thickness is 135 nm to 160 nm and the a-Si film thickness is in the vicinity of 25 nm to 45 nm, is the region having the respective preferable film thickness ranges. By forming the a-Si film thickness and the $SiO_2$ film thickness within the respective film thickness ranges, it is possible to stably perform crystallization by laser annealing having a wavelength in the visible light region.

In FIG. 20C, the preferred values of the a-Si film thickness and the $SiO_2$ film thickness, as film thickness configurations, are shown, and these are the central values of the region surrounded by the ellipse. Specifically, the SiN film thickness is 50 nm, the a-Si film thickness central value is 35 nm, and the $SiO_2$ film thickness central value is 160 nm. In addition, an absorptance of the a-Si film of 32.3 percent is shown for these values.

Furthermore, the upper level of FIG. 20C shows an a-Si film thickness range (−9 nm to +10 nm) in which the absorptance value with respect to the a-Si film thickness central value 30 nm becomes ±3 percent, and a $SiO_2$ film thickness range (−40 nm to +16 nm) in which the absorptance value with respect to the $SiO_2$ film thickness central value 160 nm becomes ±3 percent. Here, each numerical figure in parenthesis written for the upper and lower limits of the respective film thickness ranges is the percentage of the corresponding upper or lower limit with respect to the film thickness center. For example, 25% written for the lower limit value of the a-Si film thickness range (35 nm, −9 nm) corresponds to the percentage of 9 nm with respect to the a-Si central value 35 nm. The same applies for the others.

Furthermore, the lower level of FIG. 20C shows, as relative values, the a-Si film thickness range and the $SiO_2$ film thickness range in which the value of the absorptance becomes 32%×0.97 to 32%×1.03 (in relative terms, absorptance value is ±3%).

Figure 21B:
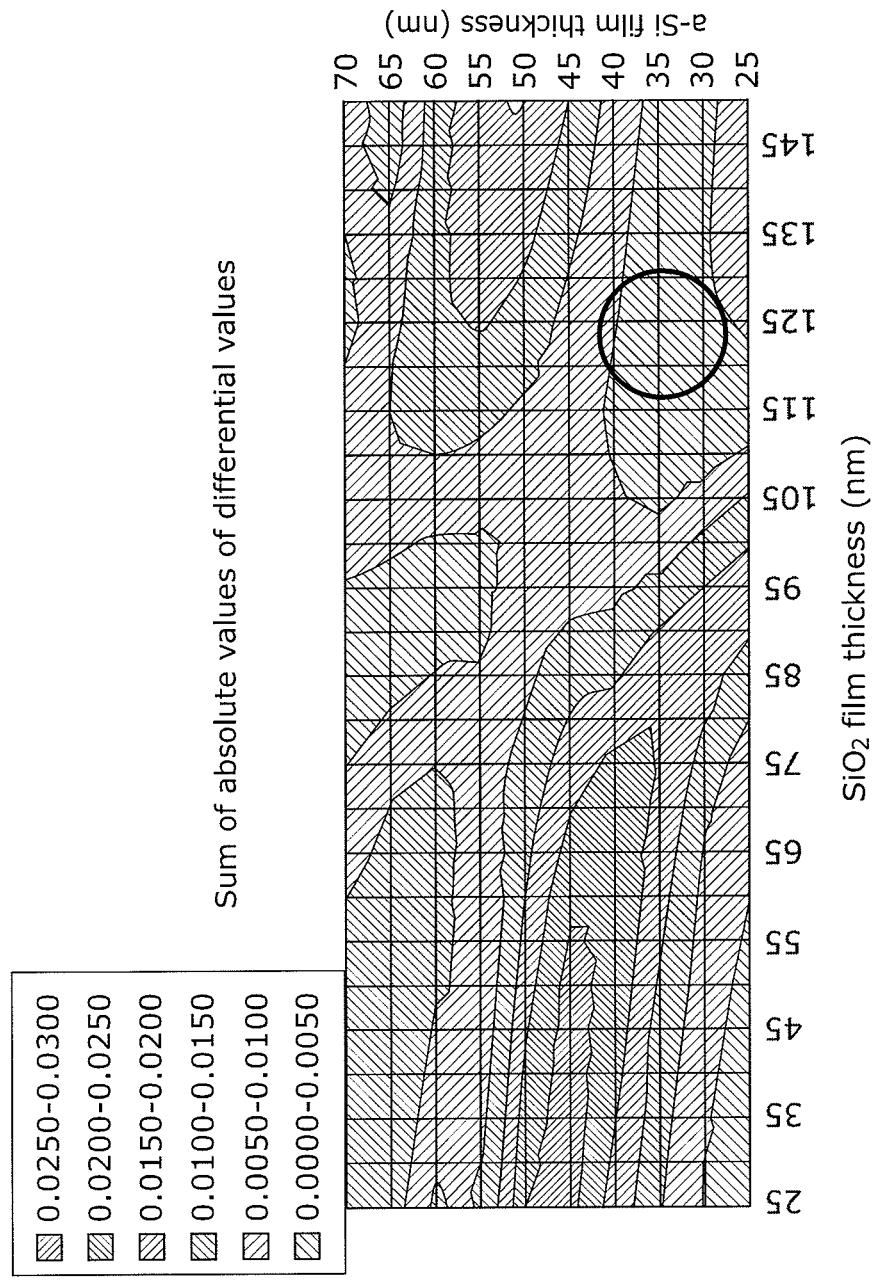
FIG. 21B is a graph showing calculation results when the a-Si film thickness and the $SiO_2$ film thickness are changed in the case where the film thickness of the SiN film is fixed at 50 nm.
Figure 22A:
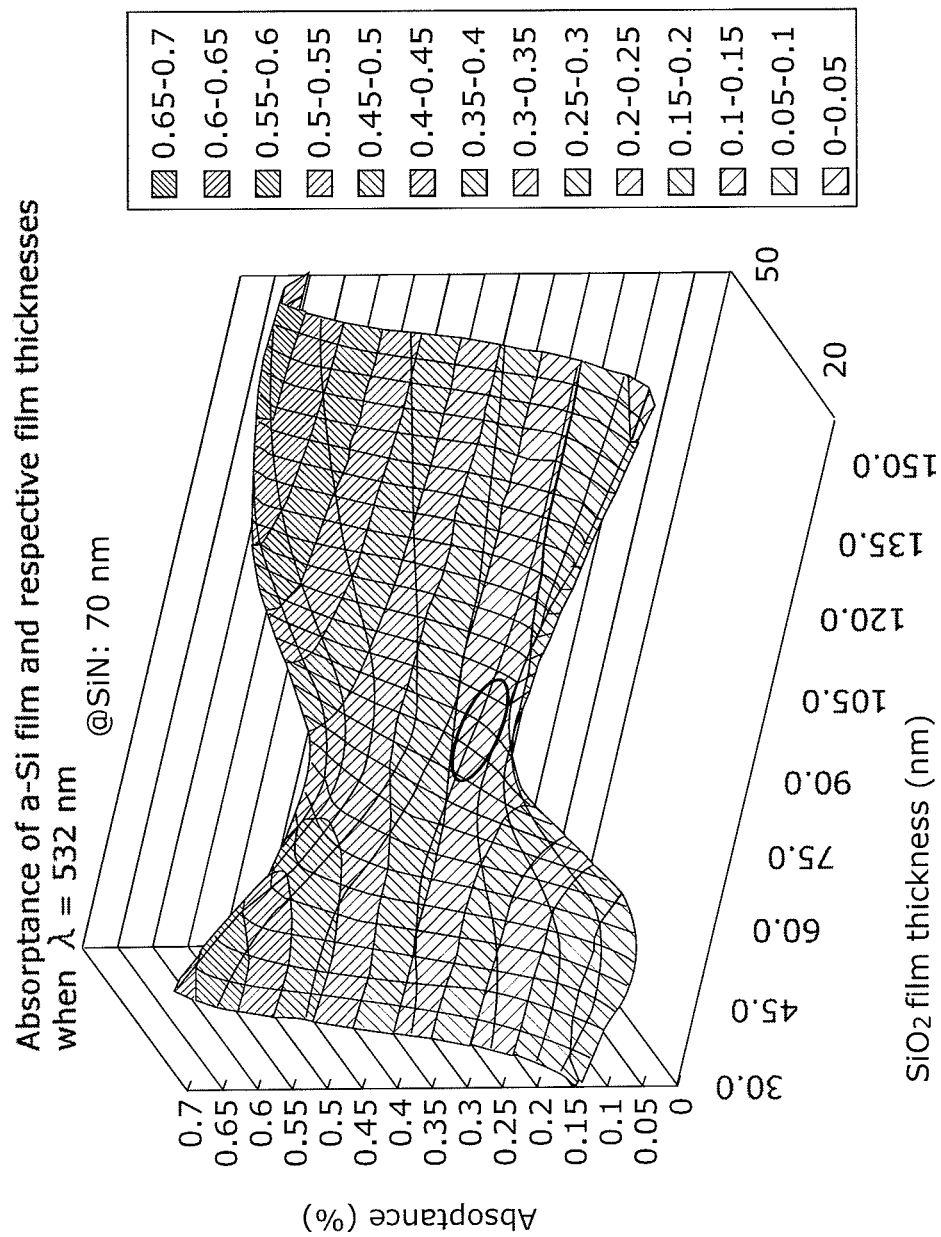
FIG. 22A is a graph showing calculation results when the a-Si film thickness and the $SiO_2$ film thickness are changed in the case where the film thickness of the SiN film is fixed at 70 nm.
Figure 22B:
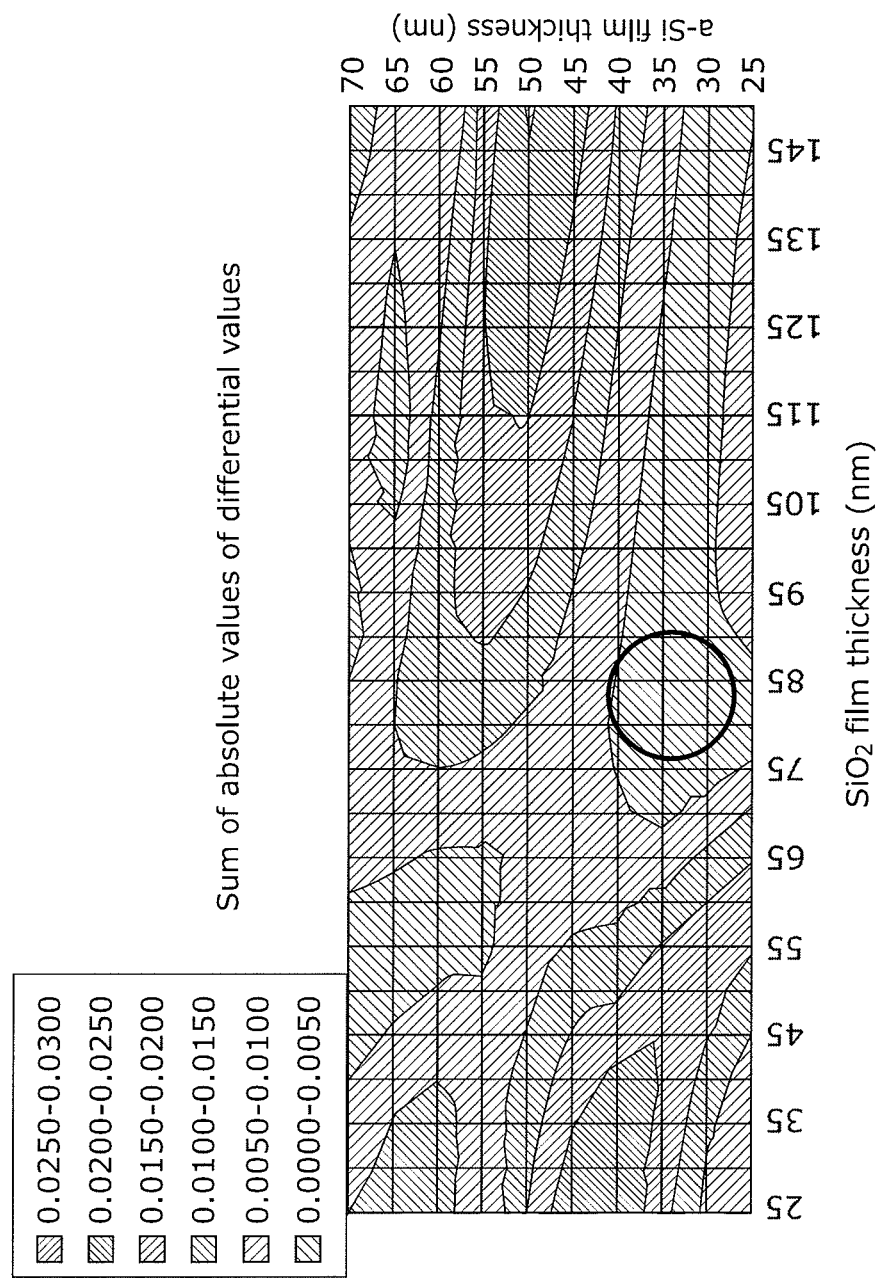
FIG. 22B is a graph showing calculation results when the a-Si film thickness and the $SiO_2$ film thickness are changed in the case where the film thickness of the SiN film is fixed at 70 nm.
Figure 23A:
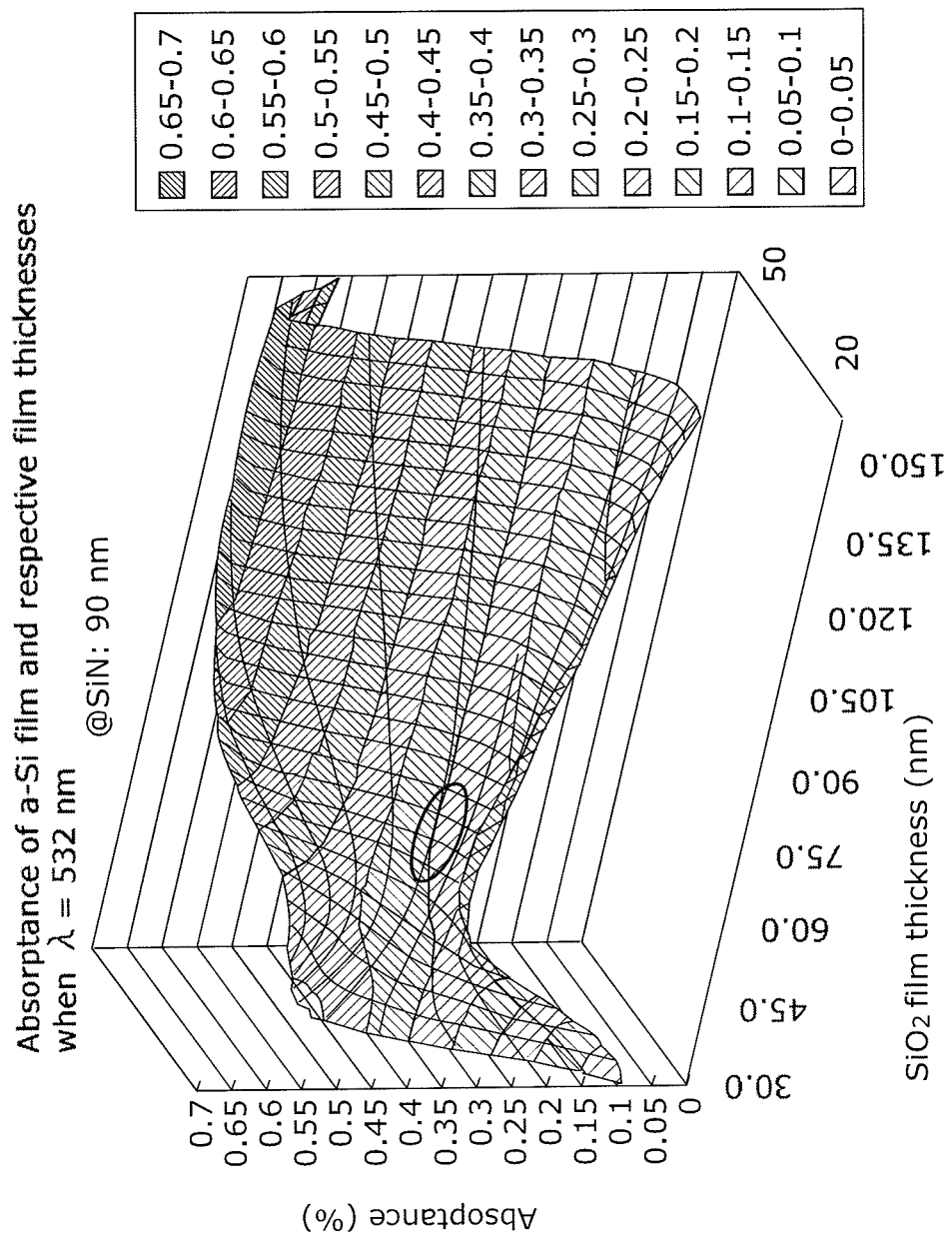
FIG. 23A is a graph showing calculation results when the a-Si film thickness and the $SiO_2$ film thickness are changed in the case where the film thickness of the SiN film is fixed at 90 nm.
Figure 23B:
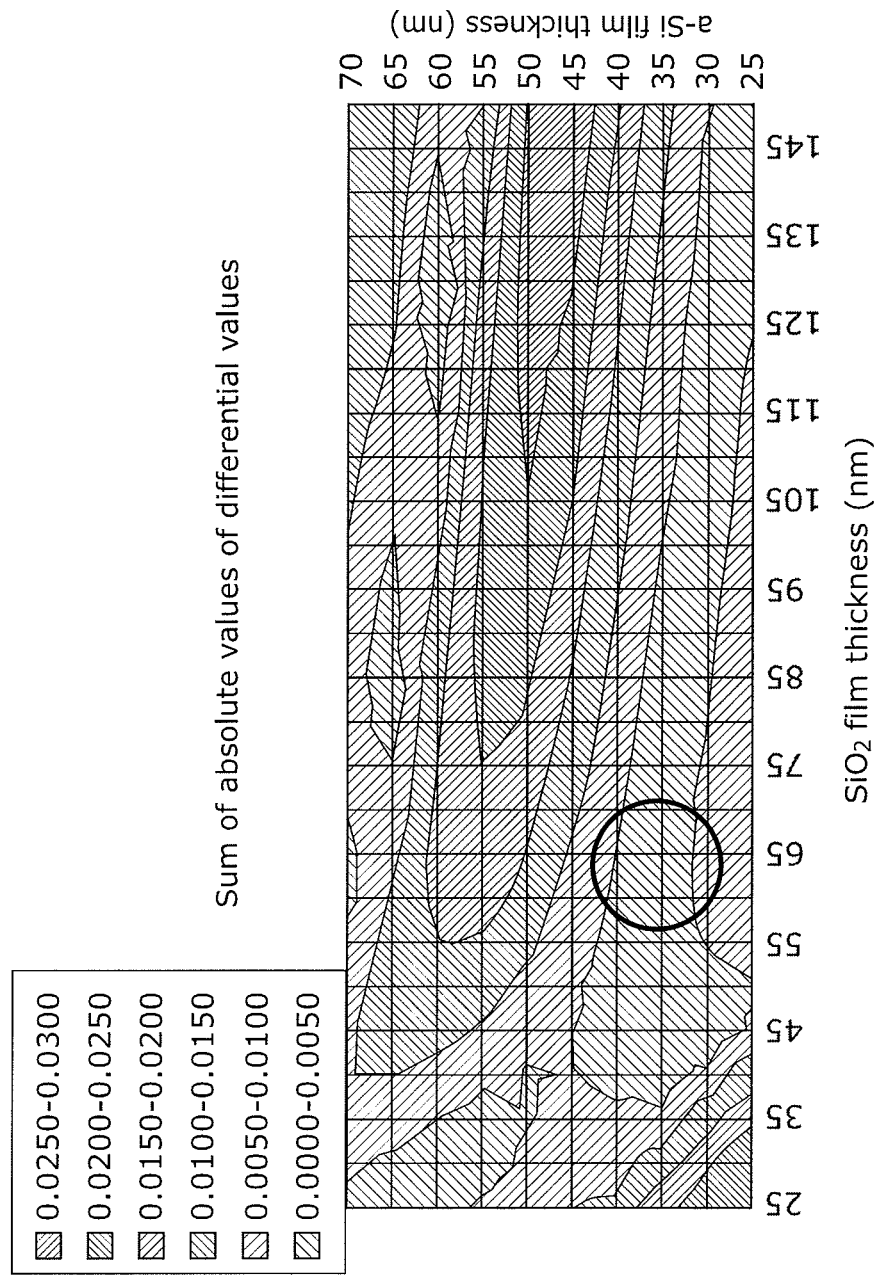
FIG. 23B is a graph showing calculation results when the a-Si film thickness and the $SiO_2$ film thickness are changed in the case where the film thickness of the SiN film is fixed at 90 nm.

In the same manner, FIG. 21A to FIG. 21C show calculation results for the case where the thickness of the SiN film is fixed at 50 nm, and FIG. 22A to FIG. 22C show calculation results for the case where the thickness of the SiN film is fixed at 70 nm. FIG. 23A to FIG. 23C are diagrams showing calculation results for the case where the thickness of the SiN film is fixed at 90 nm.

Figures 24, 25:
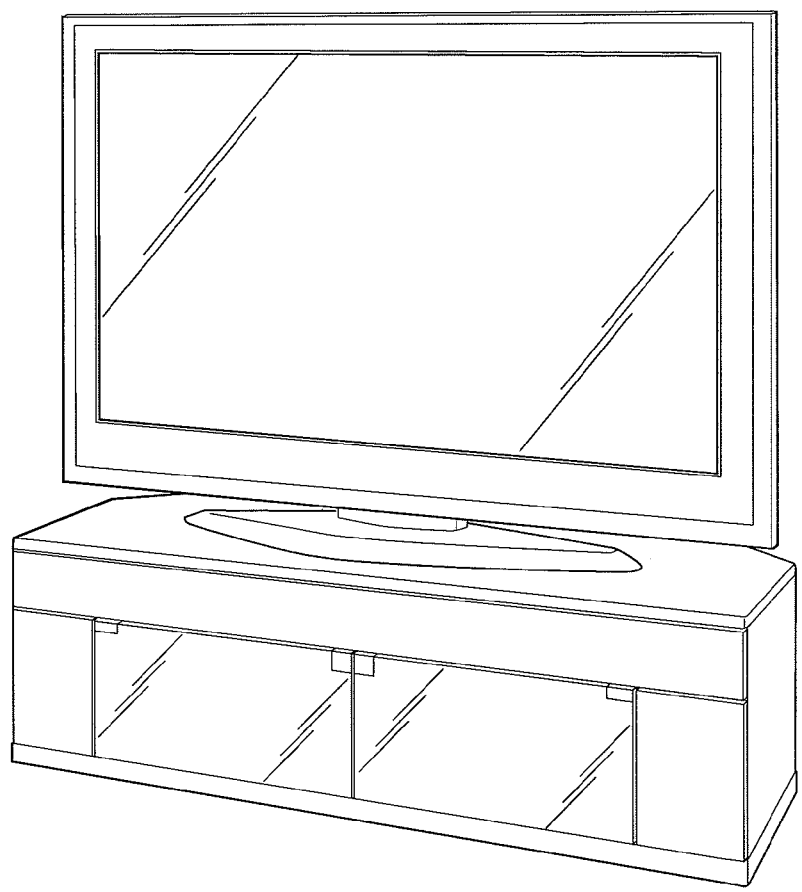
FIG. 24 is a table showing film thickness configurations for which effects of film thickness unevenness are most suppressed.
FIG. 25 is a diagram showing an example of a display device using the thin-film transistor in the present invention.

The values of the combinations of film thicknesses for which the effects of film thickness unevenness are most suppressed is extracted from FIG. 20A to FIG. 23C and shown in FIG. 24.

FIG. 24 is a table showing film thickness configurations for which the effects of film thickness unevenness are most suppressed.

FIG. 24 shows the values obtained by converting, into an optical path length, the respective combinations of film thicknesses for which the effects of film thickness unevenness are most suppressed. Here, an optical path length is computed by calculating d(SiO$_2$)×NSiO$_2$+d(SiN)×NSiN. As a result, it can be seen that the optical path length of the combination of film thicknesses for which the effects of film thickness unevenness are most suppressed is between 260 nm and 280 nm, inclusive, which is a value that is close to approximately half the wavelength of the laser light to be introduced. On the other hand, it can be seen that, regardless of the SiN film thickness, the value of the a-Si film thickness becomes smallest at the 35 nm part.

Based on the foregoing, the a-Si film thickness is formed so that the film thickness becomes 35 nm, and each of the SiN film and the SiO$_2$ film is formed within a film thickness range such that either the sum of the respective optical paths is approximately half the wavelength of the laser to be used or the total of the optical path lengths is between 250 nm and 280 nm, inclusive. In so doing, the effects of a-Si film thickness unevenness arising during the forming using CVD are not felt, and stable crystallization becomes possible.

Thus, according to the present invention, it is possible to realize: a crystal silicon film forming method of forming a crystal silicon film having stable crystallization properties, using a laser having a wavelength in the visible light region; a thin-film transistor and display device which use the crystal silicon film.

Specifically, when the a-Si film and the insulating film which is the base film thereof are formed by CVD, normally the film thickness fluctuates by approximately ±10 percent. However, when the a-Si film and the insulating film which is the base film thereof are formed within the corresponding film thickness range described above, it is possible to perform crystallization (changing to poly-Si) with the effects of film thickness fluctuation in the laser crystallization process being suppressed. As such, with the thin-film transistor (TFT) including the a-Si film and the insulating film which is the base film of the a-Si film, it is possible to realize homogeneous thin-film transistor characteristics. In addition, when the thin-film transistor in the present invention is used in the display device shown in FIG. 25, it is possible to realize a high-picture quality display device having homogeneous TFT characteristics. Furthermore, improvement of yield and reduced costs due to improvement of display quality also become possible.

Although a crystal silicon film forming method, and a thin-film transistor and display device which use the crystal silicon film, according to the present invention have been described based on the embodiments, the present invention is not limited to such embodiments. Various modifications of the exemplary embodiment as well as embodiments resulting from arbitrary combinations of constituent elements of different exemplary embodiments that may be conceived by those skilled in the art are intended to be included within the scope of the present invention as long as these do not depart from the essence of the present invention.

It should be noted that although the present invention describes a laser as a light source for crystallizing the a-Si film, rapid thermal annealing (RTA) using visible light such as a tungsten lamp for example is also acceptable as a substitute for laser, and the above-described crystallization is possible. In other words, it should be obvious that the same effects as the present invention described above are realized even when such light sources are used. Therefore, cases where these light sources are used are also included in the scope of the present invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

Industrial Applicability

The present invention can be used in a crystal silicon film forming method, and a thin-film transistor and display device which use the crystal silicon film, and can be used, in particular, in a high-picture quality display device having homogeneous TFT characteristics, because crystallization can be performed with the effects of the film thickness fluctuation of the a-Si film and the insulating film which is the base film of the a-Si film being suppressed.

What is claimed is:

1. A crystal silicon film forming method comprising:
    forming a metal film above an insulating substrate including glass, the metal film being made of a refractory metal or alloy both of which include Mo or MoW;
    forming an insulating film on the metal film; and
    forming a crystal silicon film on the insulating film, the silicon film being made of polycrystal Si,
    wherein in the forming of an insulating film, the insulating film is formed within a film thickness range of 50 nm to 250 nm,
    the forming of a crystal silicon film includes:
        forming an amorphous silicon film made of a-Si on the insulating film, within a film thickness range of 20 nm to 80 nm; and
        forming the crystal silicon film from the amorphous silicon film by irradiating the amorphous silicon film with a light of a green laser such that:
            a first light component is absorbed by the amorphous silicon film when the amorphous silicon film is irradiated with the light of the green laser;
            a first reflected light component is reflected off the metal film when the light of the green laser passes through the amorphous silicon film and the insulating film; and
            a second light component is absorbed by the amorphous silicon film when the light of the green laser passes through the amorphous silicon film and multiple beam interference occurs between the light and a second reflected light component reflected that is reflected off an interface of the amorphous silicon film and the insulating film, and
    the sum of (i) an absolute value of a value obtained by partially differentiating, with respect to a film thickness of the insulating film, an absorptance of the amorphous silicon film regarding the second light component and (ii) an absolute value of a value obtained by partially differentiating, with respect to a film thickness of the amorphous film, the absorptance of the amorphous silicon film regarding the second light component, is within a range of 0.0000 to 0.0050.

2. The crystal silicon film forming method according to claim 1,
    wherein in the forming of an insulating film, the insulating film is formed from a SiO$_2$ film.

3. The crystal silicon film forming method according to claim 1, wherein in the forming of an insulating film, the insulating film is formed from a SiO₂ film and a SiN film that are stacked.

4. The crystal silicon film forming method according to claim 3,
wherein in the forming of an insulating film, the insulating film is formed within a film thickness range in which a total of optical path lengths of the SiO₂ film and the SiN film is between 260 nm and 280 nm, inclusive.

5. The crystal silicon film forming method according to claim 4,
wherein in the forming of an insulating film, the SiN film is formed to have a film thickness of 70 nm.

6. The crystal silicon film forming method according to claim 3,
wherein in the forming of an insulating film, the insulating film is formed within a film thickness range in which a total of optical path lengths of the SiO₂ film and the SiN film is approximately half of a central value of a wavelength of the light emitted by the green laser.

7. A thin-film transistor comprising
a thin-film transistor (TFT) having a bottom-gate structure,
wherein the TFT includes the metal film, the insulating film, and the amorphous silicon film that are formed using the method according to claim 1,
the metal film is a gate electrode,
the insulating film is a gate insulating film, and
the amorphous silicon film is a channel portion.

8. A display device including a liquid crystal panel or an organic electroluminescence (EL) panel, the display device comprising
the thin-film transistor according to claim 7,
wherein the thin-film-transistor drives the liquid crystal panel or the organic EL panel.

9. A crystal silicon film forming method comprising:
forming a metal film above an insulating substrate including glass, the metal film being made of a refractory metal or alloy both of which including Mo or MoW;
forming an insulating film on the metal film; and
forming a crystal silicon film on the insulating film, the silicon film being made of polycrystal Si,
wherein in the forming of an insulating film, the insulating film is formed from a SiO₂ film of a predetermined film thickness range,
the forming of a crystal silicon film includes:
forming an amorphous silicon film made of a-Si on the insulating film, within a predetermined film thickness range; and
forming the crystal silicon film from the amorphous silicon film by irradiating a light of a green laser on the amorphous silicon film such that:
a first light component is absorbed by the amorphous silicon film when the light of the green laser is irradiated on the amorphous silicon film;
a first reflected light component is reflected off the metal film when the light of the green laser passes through the amorphous silicon film and the insulating film; and
a second light component is absorbed by the amorphous silicon film when the light of the green laser passes through the amorphous silicon film and multiple beam interference occurs between the light and a second reflected light component that is reflected off an interface of the amorphous silicon film and the insulating film, and the predetermined film thickness range of the SiO₂ film and the predetermined film thickness range of the amorphous silicon film correspond to a region satisfying any one of Expression 1 to Expression 4, when a film thickness of the SiO₂ film is denoted as d(SiO₂) nm and a film thickness of the amorphous silicon film is denoted as d(a-Si) nm:

$d(a\text{-Si}) \geq 25$ nm, and $d(\text{SiO}_2) \geq 80$ nm, and $d(a\text{-Si}) \leq (-0.0015 \times (d(\text{SiO}_2))^2 + 0.1929 \times d(\text{SiO}_2) + 30.105)$ nm;  Expression 1

(a-Si film thickness upper limit)

$d(a\text{-Si}) \leq 75$ nm, where $d(\text{SiO}_2) \leq 170$ nm, and $d(a\text{-Si}) \leq (-0.0001 \times (d(\text{SiO}_2))^3 + 0.0969 \times (d(\text{SiO}_2))^2 - 22.395 \times (d(\text{SiO}_2)) + 1769.8)$ nm, where $d(\text{SiO}_2) \geq 170$ nm (a-Si film thickness lower limit)

$d(a\text{-Si}) \geq -0.007 \times (d(\text{SiO}_2))^3 + 0.2932 \times (d(\text{SiO}_2))^2 - 38.913 \times (d(\text{SiO}_2)) + 1797.2$ nm, where 120 nm $\leq d(\text{SiO}_2) \leq 163$ nm, and $d(a\text{-Si}) \geq -0.0438 \times (d(\text{SiO}_2))^2 - 16.494 \times (d(\text{SiO}_2)) + 1574.8$ nm, where 163 nm $\leq d(\text{SiO}_2) \leq 200$ nm, and $d(a\text{-Si}) \geq -0.12 \times (d(\text{SiO}_2)) + 52$ nm, where 200 nm $\leq d(\text{SiO}_2)$;  Expression 2

$d(\text{SiO}_2) \geq 80$ nm, and $d(a\text{-Si}) \leq 0.002 \times (d(\text{SiO}_2))^2 + 0.2489 \times d(\text{SiO}_2) + 57.966$ nm, and $d(a\text{-Si}) \geq 0.0005 \times (d(\text{SiO}_2))^2 - 0.1681 \times d(\text{SiO}_2) + 67.03$ nm; and  Expression 3

$d(a\text{-Si}) \leq 75$ nm, and $d(a\text{-Si}) \leq 0.0087 \times (d(\text{SiO}_2))^2 - 4.421 \times d(\text{SiO}_2) + 628.38$ nm, and $d(a\text{-Si}) \geq 0.0031 \times (d(\text{SiO}_2))^2 - 1.5578 \times d(\text{SiO}_2) + 255.6$ nm.  Expression 4

10. A thin-film transistor comprising
a thin-film transistor (TFT) having a bottom-gate structure,
wherein the TFT includes the metal film, the insulating film, and the amorphous silicon film that are formed using the method according to claim 9,
the metal film is a gate electrode,
the insulating film is a gate insulating film, and
the amorphous silicon film is a channel portion.

11. A display device including a liquid crystal panel or an organic electroluminescence (EL) panel, the display device comprising
the thin-film transistor according to claim 10,
wherein the thin-film transistor drives the liquid crystal panel or the organic EL panel.

12. A crystal silicon film forming method comprising:
forming a metal film above an insulating substrate including glass, the metal film being made of a refractory metal or alloy both of which including Mo or MoW;
forming an insulating film on the metal film; and
forming a crystal silicon film on the insulating film, the silicon film being made of polycrystal Si, wherein in the forming of an insulating film, the insulating film is formed from a SiO$_2$ film and a SiN film that are of a predetermined film thickness range, the forming of a crystal silicon film includes:

forming an amorphous silicon film made of a-Si on the insulating film, within a predetermined film thickness range; and forming the crystal silicon film from the amorphous silicon film by irradiating a light of a green laser on the amorphous silicon film such that:

a first light component is absorbed by the amorphous silicon film when the light of the green laser is irradiated on the amorphous silicon film;

a first reflected light component is reflected off the metal film when the light of the green laser passes through the amorphous silicon film and the insulating film; and a second light component is absorbed by the amorphous silicon film when the light of the green laser passes through the amorphous silicon film and multiple beam interference occurs between the light and a second reflected light component that is reflected off an interface of the amorphous silicon film and the insulating film, and the predetermined film thickness range of the SiO$_2$ film, the predetermined film thickness range of the SiN film, and the predetermined film thickness range of the amorphous silicon film correspond to a region satisfying one of Expression 5 and Expression 6, when a film thickness of the SiO$_2$ film is denoted as d(SiO$_2$) nm and a film thickness of the amorphous silicon film is denoted as d(a-Si) nm:

$d(a\text{-Si}) \geq 25$ nm, and $d(a\text{-Si}) \leq 45$ nm, and $d(\text{SiO}_2) \geq 55$ nm, and $d(\text{SiO}_2) < 120$ nm, and $d(\text{SiN}) \geq 30$ nm, and $d(\text{SiN}) \leq 90$ nm; \hfill Expression 5

$d(a\text{-Si}) \geq 25$ nm, and $d(a\text{-Si}) \leq 45$ nm, and $d(\text{SiO}_2) > 120$ nm, and $d(\text{SiO}_2) \leq 150$ nm, and $d(\text{SiN}) \geq 30$ nm, and $d(\text{SiN}) \leq 90$ nm. \hfill Expression 6

13. The crystal silicon film forming method according to claim 12, wherein in the forming of an insulating film, the insulating film is formed within a film thickness range in which a total of optical path lengths of the insulating film, the SiO$_2$ film, and the SiN film is approximately half of a central value of a wavelength of the light irradiated by the green laser.

14. The crystal silicon film forming method according to claim 13, wherein in the forming of an insulating film, the SiN film is formed to have a film thickness of 70 nm.

* * * * *